US012132118B2

(12) United States Patent
Liu et al.

(10) Patent No.: US 12,132,118 B2
(45) Date of Patent: Oct. 29, 2024

(54) SEMICONDUCTOR DEVICE HAVING A MULTILAYER SOURCE/DRAIN REGION AND METHODS OF MANUFACTURE

(71) Applicant: Taiwan Semiconductor Manufacturing Co., Ltd., Hsinchu (TW)

(72) Inventors: Wei-Min Liu, Hsinchu (TW); Li-Li Su, Chubei (TW); Yee-Chia Yeo, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 289 days.

(21) Appl. No.: 17/231,183

(22) Filed: Apr. 15, 2021

(65) Prior Publication Data

US 2022/0336677 A1 Oct. 20, 2022

(51) Int. Cl.
*H01L 29/786* (2006.01)
*H01L 29/06* (2006.01)
*H01L 29/66* (2006.01)

(52) U.S. Cl.
CPC .... *H01L 29/78696* (2013.01); *H01L 29/0665* (2013.01); *H01L 29/66742* (2013.01)

(58) Field of Classification Search
CPC ........... H01L 29/78696; H01L 29/0665; H01L 29/66469; H01L 29/42392; H01L 21/823418; H01L 21/823431; H01L 27/0886; H01L 29/66742; H01L 29/0847; H01L 29/0673; H01L 29/66439; H01L 29/775; H01L 21/823412; B82Y 10/00; Y02P 70/50
See application file for complete search history.

(56) References Cited

U.S. PATENT DOCUMENTS

| | | | |
|---|---|---|---|
| 9,209,247 B2 | 12/2015 | Colinge et al. | |
| 9,236,267 B2 | 1/2016 | De et al. | |
| 9,412,817 B2 | 8/2016 | Yang et al. | |
| 9,412,828 B2 | 8/2016 | Ching et al. | |
| 9,443,931 B2 * | 9/2016 | Zang | H01L 21/3086 |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |

(Continued)

*Primary Examiner* — Kimberly N Rizkallah
*Assistant Examiner* — Pratiksha Jayant Lohakare
(74) *Attorney, Agent, or Firm* — Slater Matsil, LLP

(57) ABSTRACT

Semiconductor devices and methods of fabricating the semiconductor devices are described herein. The method includes steps for patterning fins in a multilayer stack and forming an opening in a fin as an initial step in forming a source/drain region. The opening is formed into a parasitic channel region of the fin. Once the opening has been formed, a first semiconductor material is epitaxially grown at the bottom of the opening to a level over the top of the parasitic channel region. A second semiconductor material is epitaxially grown from the top of the first semiconductor material to fill and/or overfill the opening. The second semiconductor material is differently doped from the first semiconductor material. A stack of nanostructures is formed by removing sacrificial layers of the multilayer stack, the second semiconductor material being electrically coupled to the nanostructures.

19 Claims, 17 Drawing Sheets

(56) References Cited

U.S. PATENT DOCUMENTS

| | | | |
|---|---|---|---|
| 9,576,814 B2 | 2/2017 | Wu et al. | |
| 9,608,116 B2 | 3/2017 | Ching et al. | |
| 9,876,055 B1* | 1/2018 | Chen | H10N 70/066 |
| 10,121,870 B1* | 11/2018 | Chiang | H01L 29/66469 |
| 10,522,419 B2* | 12/2019 | Ando | H01L 29/66439 |
| 11,011,643 B2* | 5/2021 | Xu | B82Y 10/00 |
| 2015/0206946 A1* | 7/2015 | Chen | H01L 29/0847 |
| | | | 438/300 |
| 2015/0255637 A1* | 9/2015 | Bosco | H01L 31/032 |
| | | | 438/95 |
| 2015/0279852 A1* | 10/2015 | Mizutani | H10B 41/27 |
| | | | 257/315 |
| 2016/0380056 A1* | 12/2016 | Yeo | H01L 29/42392 |
| | | | 438/283 |
| 2017/0047325 A1* | 2/2017 | Mehta | H01L 29/0847 |
| 2017/0104061 A1* | 4/2017 | Peng | H01L 29/78696 |
| 2018/0261688 A1* | 9/2018 | Zhou | H01L 29/66795 |
| 2018/0277630 A1* | 9/2018 | Bi | H01L 25/072 |
| 2019/0081155 A1* | 3/2019 | Xie | H01L 29/66553 |
| 2019/0148527 A1* | 5/2019 | More | H01L 29/0847 |
| | | | 257/401 |
| 2019/0172532 A1* | 6/2019 | Futase | G11C 13/0064 |
| 2020/0051981 A1* | 2/2020 | Yang | H01L 27/092 |
| 2020/0066508 A1* | 2/2020 | Doris | H01L 29/66545 |
| 2020/0212292 A1* | 7/2020 | Cheng | H10N 50/85 |
| 2020/0303521 A1* | 9/2020 | Son | H01L 29/66439 |

* cited by examiner

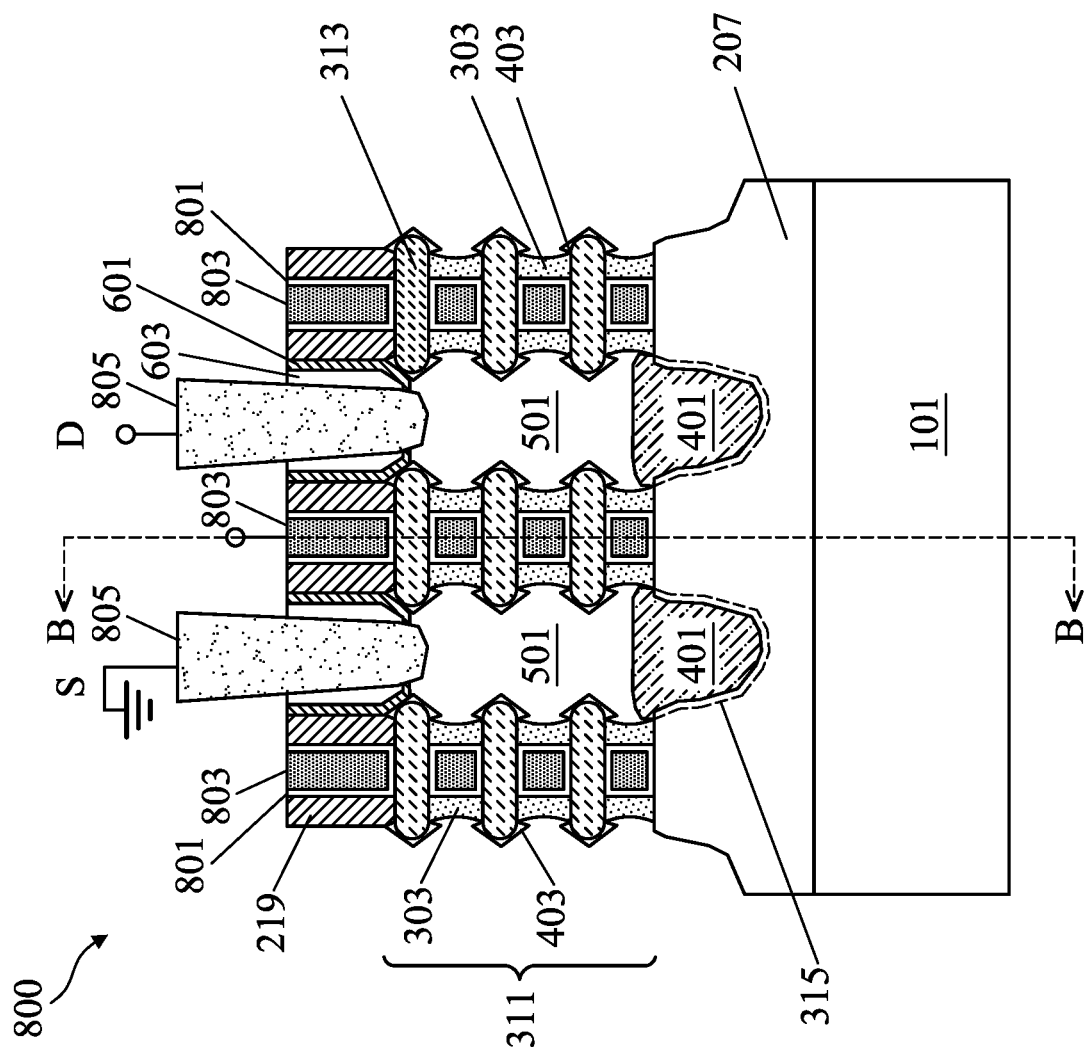

SEMICONDUCTOR DEVICE HAVING A MULTILAYER SOURCE/DRAIN REGION AND METHODS OF MANUFACTURE

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 8A and 8B illustrate cross-sectional views of a first semiconductor device, in accordance with some embodiments.

DETAILED DESCRIPTION

Figure 1:
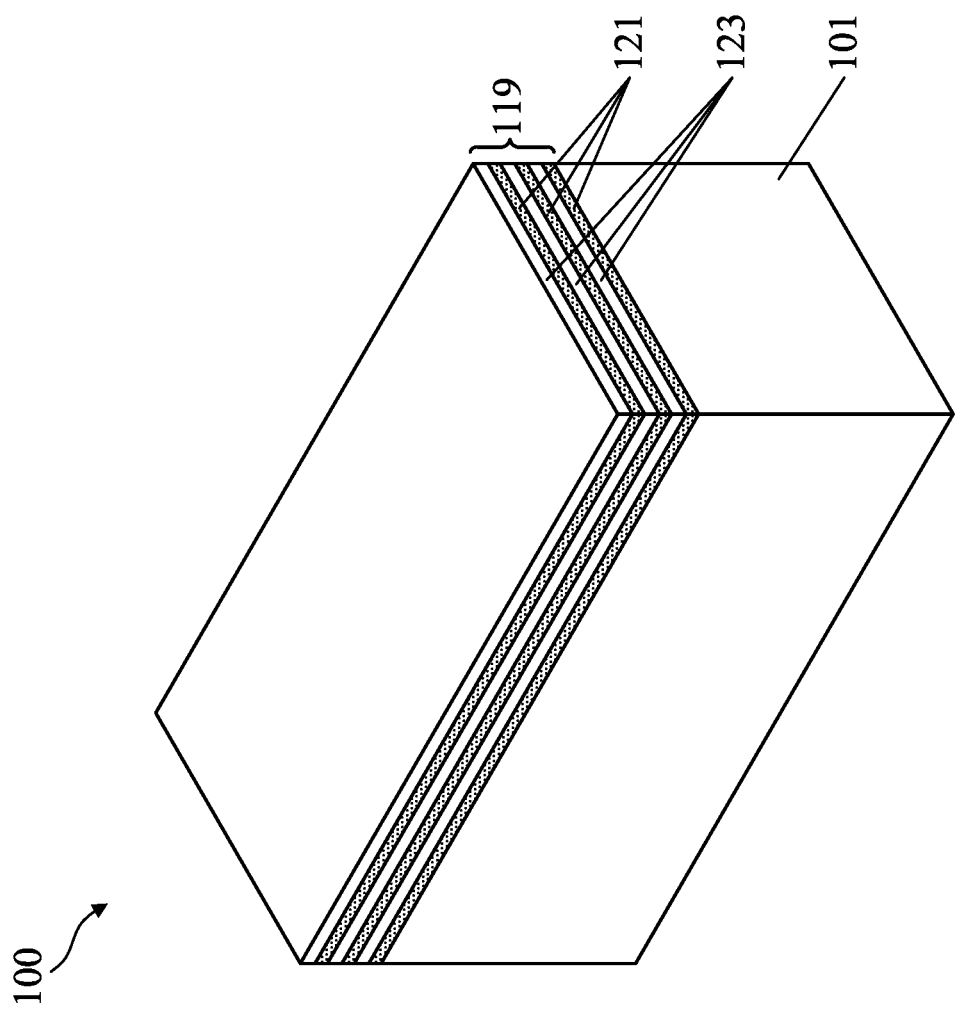
FIG. 1 illustrates, in a perspective view, a multilayer structure used to form an integrated circuit device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to a particular embodiment which forms multiple active components including multiple nanostructure devices. However, the embodiments described are intended to be illustrative and are not intended to be limited to those embodiments that are expressly described herein. Rather, the ideas presented herein may be incorporated into a wide variety of embodiments.

With reference now to FIG. 1, there is shown in a perspective view a multi-layer structure 100 comprising a substrate 101 with a multilayer stack 119 of semiconductor materials formed over the substrate 101. The substrate 101 may be a silicon substrate, although other substrates, such as semiconductor-on-insulator (SOI), strained SOI, and silicon germanium on insulator, could be used. The substrate 101 may be a p-type semiconductor, although in other embodiments, it could be an n-type semiconductor. In some embodiments, the substrate 101 may comprise doped regions (e.g., p-type regions, n-type regions, anti-punch through doped regions, combinations, or the like).

In such embodiments, the multilayer stack 119 of semiconductor materials is formed through a series of depositions of alternating materials. In some embodiments, the multilayer stack 119 comprises first layers 121 of a first semiconductor material and second layers 123 of a second semiconductor material.

According to some embodiments, the first layers 121 may be formed using a first semiconductor material with a first lattice constant, such as SiGe, Ge, Si, GaAs, InSb, GaSb, InAlAs, InGaAs, GaSbP, GaAsSb, combinations of these, or the like. In some embodiments, a first layer 121 of the first semiconductor material (e.g., SiGe) is epitaxially grown on the substrate 101 using a deposition technique such as epitaxial growth, vapor-phase epitaxy (VPE), molecular beam epitaxy (MBE), although other deposition processes, such as chemical vapor deposition (CVD), low pressure CVD (LPCVD), atomic layer CVD (ALCVD), ultrahigh vacuum CVD (UHVCVD), reduced pressure CVD (RPCVD), combinations, or the like, may also be utilized. Once deposited, an optional planarization technique (e.g., chemical mechanical planarization (CMP)) may be performed to reduce a thickness of the first layer 121 to a desired thickness, according to some embodiments. In some embodiments, the first layer 121 is formed to first thicknesses of between about 30 Å and about 300 Å. However, any suitable thickness may be utilized while remaining within the scope of the embodiments.

Once the first layer 121 has been formed over the substrate 101, one of the second layers 123 may be formed over the first layer 121. According to some embodiments, the second layers 123 may be formed using a second semiconductor material such as Si, SiGe, Ge, GaAs, InSb, GaSb, InAlAs, InGaAs, GaSbP, GaAsSb, combinations of these, or the like with a second lattice constant that is different from the first lattice constant of the first layer 121. In a particular embodiment in which the first layer 121 is silicon germanium, the second layer 123 is a material such as silicon. However, any suitable combination of materials may be utilized for the first layers 121 and the second layers 123.

In some embodiments, the second layer 123 is epitaxially grown on the first layer 121 using a deposition technique similar to that used to form the first layer 121. Once grown, an optional planarization technique (e.g., chemical mechanical planarization (CMP)) may be performed to reduce a thickness of the second layer 123 to a desired thickness, according to some embodiments. However, the second layer 123 may use any of the deposition and/or optional planarization techniques suitable for forming the first layer 121, as set forth above or any other suitable techniques. According to some embodiments, the second layer 123 is formed to a similar thickness to that of the first layer 121. However, the second layer 123 may also be formed to a thickness that is different from the first layer 121. According to some embodiments, the second layer 123 may be formed to a second thickness of between about 10 Å and about 500 Å. However, any suitable thickness may be used.

Once the second layer 123 has been formed over the first layer 121, the deposition process is repeated to form the remaining material layers in the series of alternating materials of the first layers 121 and the second layers 123 until a desired topmost layer of the multilayer stack 119 has been formed. According to the present embodiment, the first layers 121 may be formed to a same or similar first thickness and the second layers 123 may be formed to the same or similar second thickness. However, the first layers 121 may have different thicknesses from one another and/or the second layers 123 may have different thicknesses from one another and any combination of thicknesses may be used for the first layers 121 and the second layers 123.

Although embodiments are disclosed herein comprising three of the first layers 121 and three of the second layers 123, the multilayer stack 119 may have any suitable number of layers. For example, the multilayer stack 119 may comprise a number of layers in a range between 2 to 20 layers. In some embodiments, the multilayer stack 119 may comprise equal numbers of the first layers 121 to the second layers 123; however, in other embodiments, the number of the first layers 121 may be different from the number of the second layers 123. Furthermore, the multilayer stack 119 may be formed over the substrate to any desired height.

As one of ordinary skill in the art will recognize, the process described above to form the multi-layer structure 100 is merely one potential process, and is not meant to be the only embodiment. Rather, any suitable process through which the multi-layer structure 100 may be formed may be utilized and any suitable process, including any number of deposition and optional planarization steps may be used.

Figure 2:
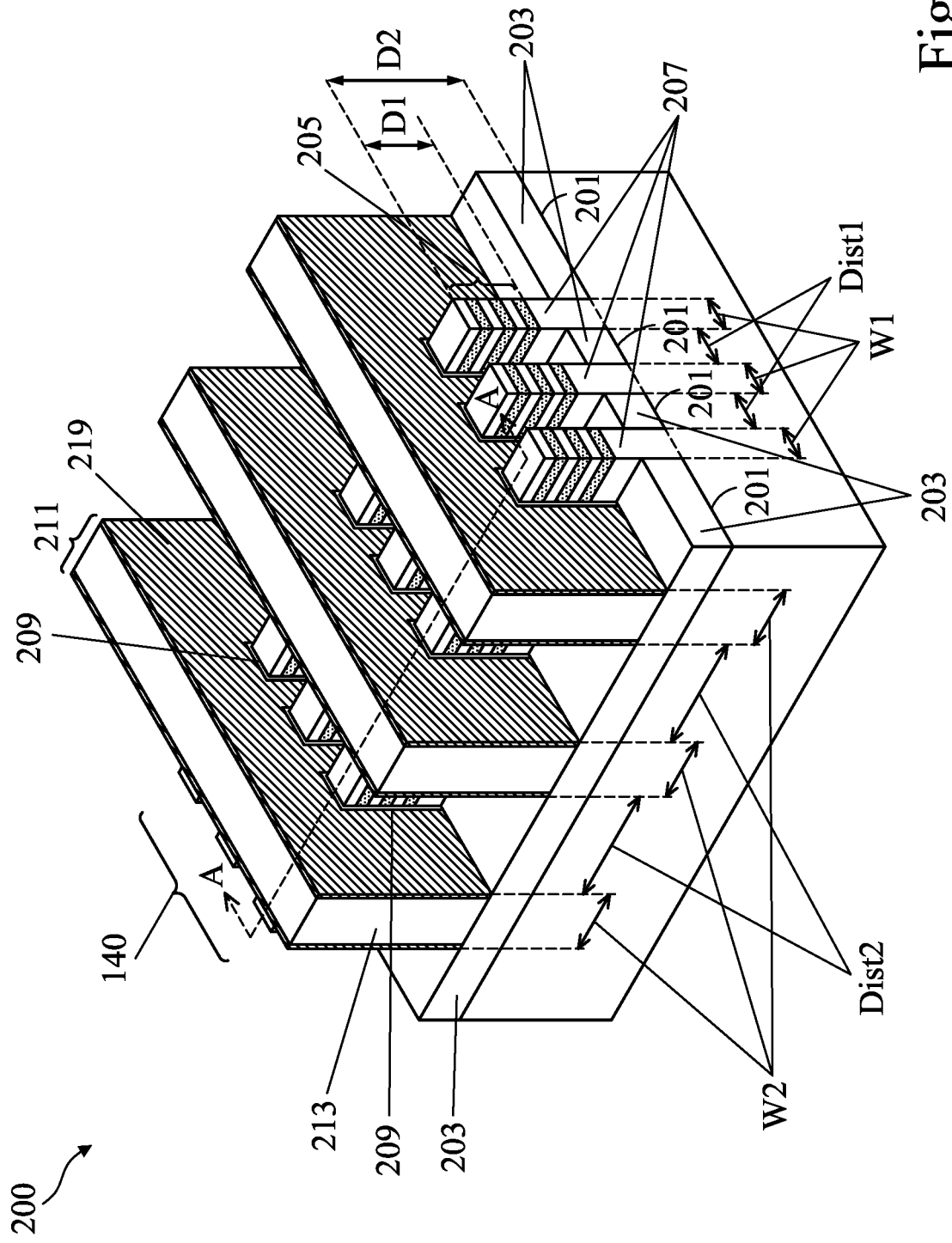
FIG. 2 illustrates a perspective view of an intermediate structure formed as an intermediate step in forming the integrated circuit device, in accordance with some embodiments.

FIG. 2 illustrates a perspective view of an intermediate structure 200 formed using the multi-layer structure 100, in accordance with some embodiments. In particular, FIG. 2 illustrates the formation of trenches 201, patterned multilayer stacks 205, and parasitic channels 207 in the multilayer structure 100. FIG. 2 further illustrates the formation of isolation regions 203 between the parasitic channels 207, and the formation of dummy gate stacks 211 and spacers 219 over the isolation regions 203, the patterned multilayer stacks 205 and the parasitic channels 207, in accordance with some embodiments.

Once the multi-layer structure 100 has been formed, the trenches 201 are formed in the multi-layer structure 100 as an initial step in the eventual formation of isolation regions 203. The trenches 201 may be formed using a masking layer (not separately illustrated in FIG. 2) along with a suitable etching process. For example, the masking layer may be a hard mask comprising silicon nitride formed through a process such as chemical vapor deposition (CVD), although other materials, such as oxides, oxynitrides, silicon carbide, combinations of these, or the like, and other processes, such as plasma enhanced chemical vapor deposition (PECVD), low pressure chemical vapor deposition (LPCVD), or even silicon oxide formation followed by nitridation, may be utilized. Once formed, the masking layer may be patterned through a suitable photolithographic process to expose those portions of the multi-layer structure 100 that will be removed to form the trenches 201.

As one of skill in the art will recognize, however, the processes and materials described above to form the masking layer are not the only method that may be used to protect portions of the multi-layer structure 100 while exposing other portions of the multi-layer structure 100 for the formation of the trenches. Any suitable process, such as a patterned and developed photoresist, may be utilized to expose portions of the multi-layer structure 100 to be removed to form the trenches 201. All such methods are fully intended to be included in the scope of the present embodiments.

Once a masking layer has been formed and patterned, the trenches 201 are formed in the multi-layer structure 100. The exposed materials of the exposed portions of the multi-layer structure 100 may be removed through suitable processes such as one or more reactive ion etches (RIE) in order to form the trenches 201 in the multi-layer structure 100, although any suitable process may be used.

However, as one of ordinary skill in the art will recognize, the process described above to form the trenches 201 is merely one potential process, and is not meant to be the only embodiment. Rather, any suitable process through which the trenches 201 may be formed may be utilized and any suitable process, including any number of masking and removal steps may be used.

In addition to forming the trenches 201, the masking and etching process additionally forms a plurality of the patterned multilayer stacks 205 overlying a plurality of the parasitic channels 207 from those portions of the multilayer stack 119 and substrate 101 that remain unremoved. The patterned multilayer stacks 205 and the parasitic channels 207 may be collectively referred to herein as "multilayer fins." For convenience, the parasitic channels 207 have been illustrated in the figures as being separated from the substrate 101 by a dashed line, although a physical indication of the separation may or may not be present. These patterned multilayer stacks 205 overlying the parasitic channels 207 may be used, as discussed below, to form active components, such as multi-channel devices (e.g., gate-all-around (GAA) metal-oxide-semiconductor field effect transistor (MOSFET), nanosheet field effect transistors (NSFETs), or the like). While FIG. 2 illustrates three of the multilayer fins, any number of the multilayer fins may be formed in the multi-layer structure 100.

According to some embodiments, the parasitic channels 207 may be formed to have a first width $W_1$ at the surface of the substrate 101 of between about 30 Å and about 5000 Å, according to some embodiments. Furthermore, the parasitic channels 207 may be formed spaced apart by a first distance Dist1 of between about 5 nm and about 100 nm. However, any suitable widths and distances may be utilized. According to some embodiments, the first width W1 of the parasitic channels 207 and/or the patterned multilayer stacks 205 may be selected according to a desired channel width of a desired multi-channel device being formed. In some embodiments, the first distance Dist1 between the multilayer fins may be close enough to share a common gate electrode or so-called "shared gate electrode."

Furthermore, while a particular embodiment has been described above to form the patterned multilayer stacks 205 overlying the parasitic channels 207 in the multi-layer structure 100, these descriptions are intended to be illustrative and are not intended to be limiting. Rather, the patterned multilayer stacks 205 and the parasitic channels 207 may be patterned by any suitable method. As another example, the patterned multilayer stacks 205 and the parasitic channels 207 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the multi-layer structure 100 and patterned using a photolithography process. Spacers are formed alongside the patterned sacrificial layer using a self-aligned process. The sacrificial layer is then removed, and the remaining spacers may then be used to pattern the patterned multilayer stacks 205 overlying the parasitic channels 207. Any suitable process may be utilized.

In an embodiment the isolation regions 203 are formed as shallow trench isolation (STI) regions by initially depositing a dielectric material in the trenches 201. According to some embodiments, the dielectric material used to form the isolation regions 203 may be a material such as an oxide material (e.g., a flowable oxide), high-density plasma (HDP) oxide, or the like. The dielectric material may be formed, after an optional cleaning and lining of the trenches, using either a chemical vapor deposition (CVD) method (e.g., the HARP process), a high density plasma CVD method, or other suitable method of formation to fill or overfill the regions around the patterned multilayer stacks 205 and the parasitic channels 207. In some embodiments, a post placement anneal process (e.g., oxide densification) is performed to densify the material of the isolation regions 203 and to reduce its wet etch rate. Furthermore one or more planarization processes such as chemical mechanical polishing (CMP), etches, combinations, or the like may be performed to remove any excess material of the isolation regions 203.

Once the dielectric material has been deposited to fill or overfill the regions around the parasitic channels 207 and the patterned multilayer stack 205, the dielectric material may then be recessed to form the isolation regions 203. The recessing may be performed to expose at least a portion of the sidewalls of the parasitic channels 207. The dielectric material may be recessed using a wet etch by dipping the structure into an etchant selective to the material of the dielectric material, although other methods, such as a reactive ion etch, a dry etch, chemical oxide removal, or dry chemical clean may be used.

FIG. 2 further illustrates the formation of a dummy gate dielectric 209 over the patterned multilayer stacks 205 and the portions of the parasitic channels 207 exposed above the isolation regions 203. The dummy gate dielectric 209 may be formed by thermal oxidation, chemical vapor deposition, sputtering, or any other methods known and used in the art for forming a gate dielectric. Depending on the technique of gate dielectric formation, the dummy gate dielectric 209 thickness on the top may be different from the dummy dielectric thickness on the sidewall. In some embodiments, the dummy gate dielectric 209 may be formed by depositing a material such as silicon and then oxidizing or nitridizing the silicon layer in order to form a dielectric such as the silicon dioxide or silicon oxynitride. In such embodiments, the dummy gate dielectric 209 may be formed to a thickness ranging from between about 3 Å and about 100 Å. In other embodiments, the dummy gate dielectric 209 may also be formed from a high permittivity (high-k) material such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of between about 0.5 Å and about 100 Å. Additionally, any combination of silicon dioxide, silicon oxynitride, and/or high-k materials may also be used for the dummy gate dielectric 209.

FIG. 2 further illustrates the formation of a dummy gate electrode 213 over the dummy gate dielectric 209, a first hard mask over the dummy gate electrode 213, and a second hard mask over the first hard mask, in accordance with some embodiments. The dummy gate dielectric 209, the dummy gate electrode 213, the first hard mask, and the second hard mask are collectively referred to herein as the dummy gate stacks 211.

In some embodiments, the dummy gate electrode 213 comprises a conductive material and may be selected from a group comprising of polysilicon, W, Al, Cu, AlCu, Ti, TiAlN, TaC, TaCN, TaSiN, Mn, Zr, TiN, Ta, TaN, Co, Ni, combinations of these, or the like. The dummy gate electrode 213 may be deposited by chemical vapor deposition (CVD), sputter deposition, or other techniques known and used in the art for depositing conductive materials. The thickness of the dummy gate electrode 213 may be in the range of about 5 Å to about 500 Å. The top surface of the dummy gate electrode 213 may have a non-planar top surface, and may be planarized prior to patterning of the dummy gate electrode 213 or gate etch. Ions may or may not be introduced into the dummy gate electrode 213 at this point. Ions may be introduced, for example, by ion implantation techniques.

Once the dummy gate electrode 213 has been formed, the dummy gate dielectric 209 and the dummy gate electrode 213 may be patterned. In an embodiment the patterning may be performed by initially forming the first hard mask over the dummy gate electrode 213 and forming the second hard mask over the first hard mask.

According to some embodiments, the first hard mask comprises a dielectric material such as silicon oxide (SiO), silicon nitride (SiN), oxide (OX), titanium nitride (TiN), silicon oxynitride (SiON), combinations of these, or the like. The first hard mask may be formed using a process such as chemical vapor deposition, plasma enhanced chemical vapor deposition, atomic layer deposition, or the like. However, any other suitable material and method of formation may be utilized. The first hard mask may be formed to a thickness of between about 20 Å and about 3000 Å.

The second hard mask comprises a separate dielectric material from the material of the first hard mask. The second hard mask may comprise any of the materials and use any of the processes suitable for forming the first hard mask and may be formed to a same or similar thickness as the first hard mask. In embodiments where the first hard mask comprises an oxide (OX), the second hard mask may be e.g., silicon nitride (SiN). However, any suitable dielectric materials, processes and thicknesses may be used to form the second hard mask.

Once the first hard mask and the second hard mask have been formed, the first hard mask and the second hard mask may be patterned. In an embodiment the masks may be patterned by initially placing a photoresist (not individually illustrated) over the second hard mask and exposing the photoresist to a patterned energy source (e.g., light) in order to initiate a chemical reaction that modifies the physical properties of the exposed portions of the first photoresist. The first photoresist may then be developed by applying a first developer (also not individually illustrated) in order to utilize the modified physical properties between the exposed region and the unexposed region to selectively remove either the exposed region or the unexposed region.

Once the photoresist has been patterned, the photoresist may be used as a mask in order to pattern the underlying hard masks. In an embodiment the first hard mask and the second hard mask may be patterned using, e.g., one or more reactive ion etching (RIE) processes with the photoresist as a mask. The patterning process may be continued until the dummy gate electrode 213 is exposed beneath the first hard mask.

Once the first hard mask and the second hard mask have been patterned, the photoresist may be removed utilizing, e.g., an ashing process, whereby a temperature of the photoresist is raised until the photoresist experiences a thermal decomposition and may be easily removed using one or more cleaning process. However, any other suitable removal process may be utilized.

Once the first hard mask and the second hard mask have been patterned, the dummy gate electrode 213 and the dummy gate dielectric 209 may be patterned in order to form a series of the dummy gate stacks 211. In an embodiment the dummy gate electrode 213 and the dummy gate dielectric 209 are patterned using an anisotropic etching process, such as a reactive ion etch, although any suitable process may be utilized. As such, the dummy gate stacks 211 are disposed over the patterned multilayer stacks 205 and the portions of the parasitic channels 207 in desired locations of multilayer channel regions to be formed. In regions between the dummy gate stacks 211, the top surfaces and sidewalls of the patterned multilayer stacks 205, sidewalls of the parasitic channels 207, and top surfaces of the isolation regions 203 are exposed. According to some embodiments, the dummy gate stacks 211 may be formed to a second width W2 of between about 2 nm and about 200 nm and may be spaced apart from one another by a second distance Dist2 of between about 5 nm and about 100 nm. However, any suitable width and distance may be utilized. According to some embodiments, the second width W2 of the dummy gate stacks 211 may be selected according to a desired channel length of the desired multi-channel device being formed. Furthermore, although FIG. 2 illustrates three of the dummy gate stacks 211, any suitable number of dummy gate stacks 211 may be formed. For example, in some embodiments, fewer than three of the dummy gate stacks 211 such as two or one of the dummy gate stacks 211 may be formed. As a further example, in some embodiments, more than three of the dummy gate stacks 211 such as four or more of the dummy gate stacks 211 stacks may be formed.

FIG. 2 further illustrates the formation of the spacers 219. According to an embodiment, a spacer material is formed by blanket deposition on the dummy gate stacks 211 and the exposed portions of the patterned multilayer stacks 205, the parasitic channels 207, and the isolation regions 203. As such, the spacer material is deposited over the top surfaces and sidewalls of the dummy gate stacks 211 and over the top surfaces and sidewalls of the patterned multilayer stacks 205, sidewalls of the parasitic channels 207, and top surfaces of the isolation regions 203 not covered by the dummy gate stacks 211. According to some embodiments, the spacer material comprises a dielectric material and is formed using methods such as chemical vapor deposition (CVD), plasma enhanced CVD, sputter, thermal oxidation, and any other suitable methods. According to some embodiments, the spacer material comprises materials such as silicon oxide ($SiO_2$), silicon oxynitride (SiON), silicon nitride ($Si_3N_4$), silicon oxycarbide (SiOC), silicon oxycarbonitride (SiOCN), although any suitable material, such as low-k materials with a k-value less than about 4.0, combination thereof, or the like may be utilized.

Once formed, the spacer material may be etched in order to shape the spacers 219 on the dummy gate stacks 211 and the parasitic channels 207 to re-expose the tops of the dummy gate stacks 211, the tops and sidewalls of the patterned multilayer stacks 205, the sidewalls of the parasitic channels 207, and the tops of the isolation regions 203. According to some embodiments, the spacer material may be etched using an anisotropic etching process (e.g., a dry etching process) such as a reactive ion etching (RIE) process, an isotropic etching process (e.g., a wet etching process), combination thereof, or the like. In some embodiments, the spacer material formed over the patterned multilayer stacks 205 and the parasitic channels 207 in source/drain regions may be recessed during the etching process and/or during a subsequent etching process such that portions along the sidewalls of the patterned multilayer stacks 205 and the parasitic channels 207 in those source/drain regions are exposed.

However, while embodiments are described using a single spacer material, this is intended to be illustrative and is not intended to be limiting. Rather, any number of spacer materials and any combinations of deposition and removal processes may be used, and all such processes are fully intended to be included within the scope of the embodiments.

FIG. 2 further illustrates a cutline A-A overlying the intermediate structure 200. Cutline A-A is taken along the length of one of the parasitic channels 207 and is used in reference with the following figures and descriptions.

Figure 3:
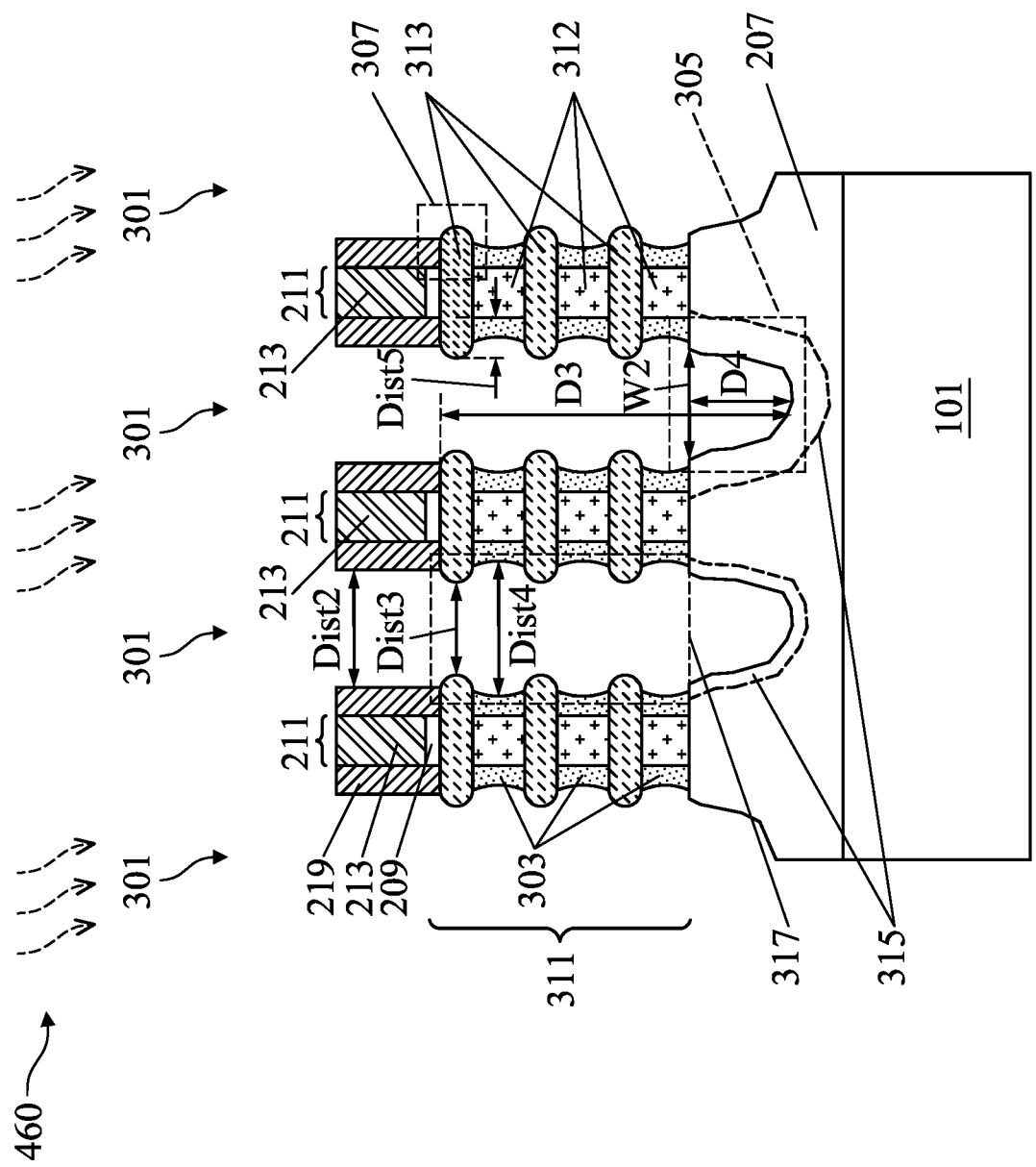
FIG. 3 illustrates a cross-sectional view of a recess etching process used in an intermediate step of forming the semiconductor device, in accordance with some embodiments.

FIG. 3 illustrates a cross-sectional view along cutline A-A of a recess etching process 350 used in an intermediate step of forming the semiconductor device, in accordance with some embodiments. In particular, FIG. 3 illustrates the formation of first openings 301 as an initial step of forming source/drain regions of the semiconductor device, in some embodiments.

According to some embodiments, the first openings 301 may be formed by using the spacers 219 as masks and performing the recess etching process 350 to selectively remove the materials of the patterned multilayer stacks 205, the parasitic channels 207, and/or the substrate 101 in desired locations of source/drain regions. As such the first openings 301 divide the patterned multilayer stacks 205 into a series of nanostructure stacks 311 within the multilayer channel regions underlying the dummy gate stacks 211. The nanostructure stacks 311 comprise the first layers 121 (relabeled sacrificial layers 312 in FIG. 3) and the second layers 123 (relabeled nanostructures 313 in FIG. 3).

In some embodiments, the first openings 301 also extend into p-type doped regions and anti-punch through regions 315 that are located within the substrate 101. In embodiments of forming an active device (e.g., gate-all-around (GAA) NMOS device), the first openings 301 are extended into the substrate 101 so that the anti-punch through regions 315 are separated by parasitic channel regions of the parasitic channel 207. According to some embodiments, the first openings 301 are formed through the patterned multilayer stacks 205 and into the anti-punch through regions 315 of the parasitic channel 207 such that the nanostructure stacks 311 are located over the parasitic channels of the parasitic channel 207.

According to some embodiments, the recess etching process 350 may be performed using a combination and/or selective tuning of multiple anisotropic etches and/or isotropic etches to remove the materials of the second layers 123, the materials of the first layers 121, and materials of the parasitic channel 207. The recess etching process 350 may be performed using anisotropic wet chemical etches, anisotropic dry etches, isotropic dry etches, combinations, or the like. The anisotropic wet chemical etches use solutions such as potassium hydroxide (KOH), tetra-methyl ammonium (TMAH) and ethylene di-amine pyrocatechol (EDP). The anisotropic dry etches use plasmas sources such as $CF_4$, $CH_3F$, $HBr$, $O_2$, $He$, $Ar$, combinations, or the like and are performed with a bias power. The isotropic dry etches use plasma sources such as $NF_3$, $CL_2$, $H_2$, $Ar$, $He$, combinations, or the like.

The recess etching process 350 may be performed using a combination of etches and/or through selectively tuning such that the sacrificial layers 312 and the nanostructures 313 are shaped to desired profiles at the sidewalls of the first openings 301. According to some embodiments, nanostructures 313 may be formed with a first channel profile 307 that has a convex round shape such that the nanostructures 313 at the sidewalls of the first openings 301 extend in a radial direction towards a centerline of the first openings 301. Furthermore, the sacrificial layers 312 may be initially formed with a profile that is substantially vertical and coterminous with the sidewalls of the first openings 301, in accordance with some embodiments.

In some embodiments, the first openings 301 may extend from the tops of the series of nano structure stacks 311 and into the parasitic channel 207 to a third depth D3. According to some embodiments, the first openings 301 extend into the parasitic channel 207 at locations of the anti-punch through regions 315 formed in the parasitic channel 207.

The recess etching process 350 may be performed using a combination of etches and/or through selectively tuning such the first openings 301 are shaped to desired recess profiles at the bottoms of the first openings 301. In some embodiments, the first openings 301 are formed to have a first recess profile 305. According to some embodiments, the first recess profile 305 is formed with a concave rounded shape having a width W2' that is about equal to the second width W2 at the top of the parasitic channel 207 and extends into the parasitic channel 207 to a fourth depth D4. The deep concave rounded shape of the first recess profile 305 may be formed, according to some embodiments, using an anisotropic dry etch with a plasma source ($CF_4$) and a power bias. As such, the first recess profile 305 is formed to have the concave rounded shape with the width W2' at the top of parasitic channel 207 of between about of between about 3 nm and about 100 nm and the fourth depth D4 of between about 0 nm and about 80 nm. However, any suitable shapes, widths, and depths may be utilized for the first recess profile 305.

FIG. 3 further illustrates the formation of inner spacers 303 in the sacrificial layers 312, in accordance with some embodiments. In an embodiment the sacrificial layers 312 may be recessed during the formation of the first openings 301 through the first layers 121. In other embodiments, the sacrificial layers 312 are initially formed coterminous with the sidewalls of the first openings 301 and are subsequently recessed to a desired distance. In some embodiments, the recesses are formed in the sacrificial layers 312 using a wet etch with an etchant that is more selective to the material of the sacrificial layers 312 (e.g., silicon germanium (SiGe)) than the material of the nanostructures 313 (e.g., silicon (Si)) or the substrate 101 (e.g., silicon (Si)). For example, in an embodiment in which the sacrificial layers 312 are silicon germanium and the nanostructures 313 are silicon, the wet etch may use an etchant such as hydrochloric acid (HCl).

In an embodiment in which the sacrificial layers 312 are recessed after forming the first opening 301, the wet etching process may be performed using a dip process, a spray process, a spin-on process, or the like and may be performed using any suitable process temperatures (e.g., between about 400° C. and about 600° C.) and any suitable process times (e.g., between about 100 seconds and about 1000 seconds). However, any suitable process conditions and parameters may be utilized. The etching process may be continued such that recesses are formed in each of the sacrificial layers 312 to a fifth distance Dist5 of between about 2 nm and about 10 nm. However, any suitable distance may be used. In accordance with some embodiments, the distal ends of the sacrificial layers 312 are formed to have vertical profiles.

However according to other embodiments, any suitable profile (e.g., facet-limited, convex, concave, or the like) may also be formed at the distal ends of the sacrificial layers 312.

However, a wet etching process is not the only process that may be utilized to recess the sacrificial layers 312. For example, in another embodiment the recessing of the sacrificial layers 312 may be performed with an isotropic dry etching process or a combination of a dry etching process and a wet etching process. Any suitable process of recessing the sacrificial layers 312 may be utilized, and all such processes are fully intended to be included within the scope of the embodiments.

Once the recesses are formed in each of the sacrificial layers 312, a spacer material is formed in the first openings 301. In some embodiments, the spacer material can be different from the material of the spacers 219 and can be a dielectric material comprising silicon such as silicon nitride (SiN), silicon oxide ($SiO_2$), silicon oxynitride (SiON), silicon oxycarbonitride (SiOCN), silicon carbonitride (SiCN), silicon oxycarbide (SiOC), although any suitable material such as low-k materials with a k-value less than about 4.0, or combination thereof may also be utilized. The spacer material may be deposited using a deposition process such as chemical vapor deposition, physical vapor deposition, or atomic layer deposition to a thickness of between about 2 nm and about 10 nm. However, any suitable thickness or deposition process may be utilized.

By depositing the spacer material over the first openings 301, the spacer material will line the sidewalls of the first openings 301 and will also fill in the recesses in the sacrificial layers 312. Once the recesses have been filled with the spacer material, a removal process is then performed to remove any excess spacer material from the first openings 301, while leaving behind the inner spacers 303. In an embodiment, the removal of the excess spacer material may be performed using an etching process such as, e.g., an anisotropic, dry etching process such as a reactive ion etching process. However, any suitable etching process, which removes the excess spacer material from the first openings 301 while leaving behind the inner spacers 303, may be utilized.

By filling the recesses with the spacer material and removing the excess spacer material from the first openings 301, the inner spacers 303 will take on the shape of the recesses. Additionally, while an embodiment forming the inner spacers 303 to faceted shapes is described, this is intended to be illustrative and is not intended to be limited. Rather, any suitable shape, such as a concave shape or a convex shape, or even the inner spacers 303 being recessed may be utilized. All such shapes are fully intended to be included within the scope of the embodiments. According to some embodiments, the inner spacers 303 may be formed to a width of between about 2 nm and about 10 nm and a height of between about 5 nm and about 20 nm. However, any suitable widths, heights, and distances may be utilized.

According to some embodiments, the recess etching process 350 is controlled and/or selectively tuned such that the first openings 301 are formed with the first recess profile 305 in the parasitic channel 207, the nanostructures 313 having the first channel profiles 307, and the inner spacers 303 having been recessed. As such, the first openings 301 are formed with a first sidewall profile 317 having a third distance Dist3 between nanostructures 313 and a fourth distance Dist4 between inner spacers 303. According to some embodiments, the third distance Dist3 is a distance between about 3 nm and about 100 nm. In some embodiments, the fourth distance Dist4 is a distance between about 3 nm and about 100 nm. However, any suitable distances may be used for the third distance Dist3 and the fourth distance Dist4.

Figure 4A:
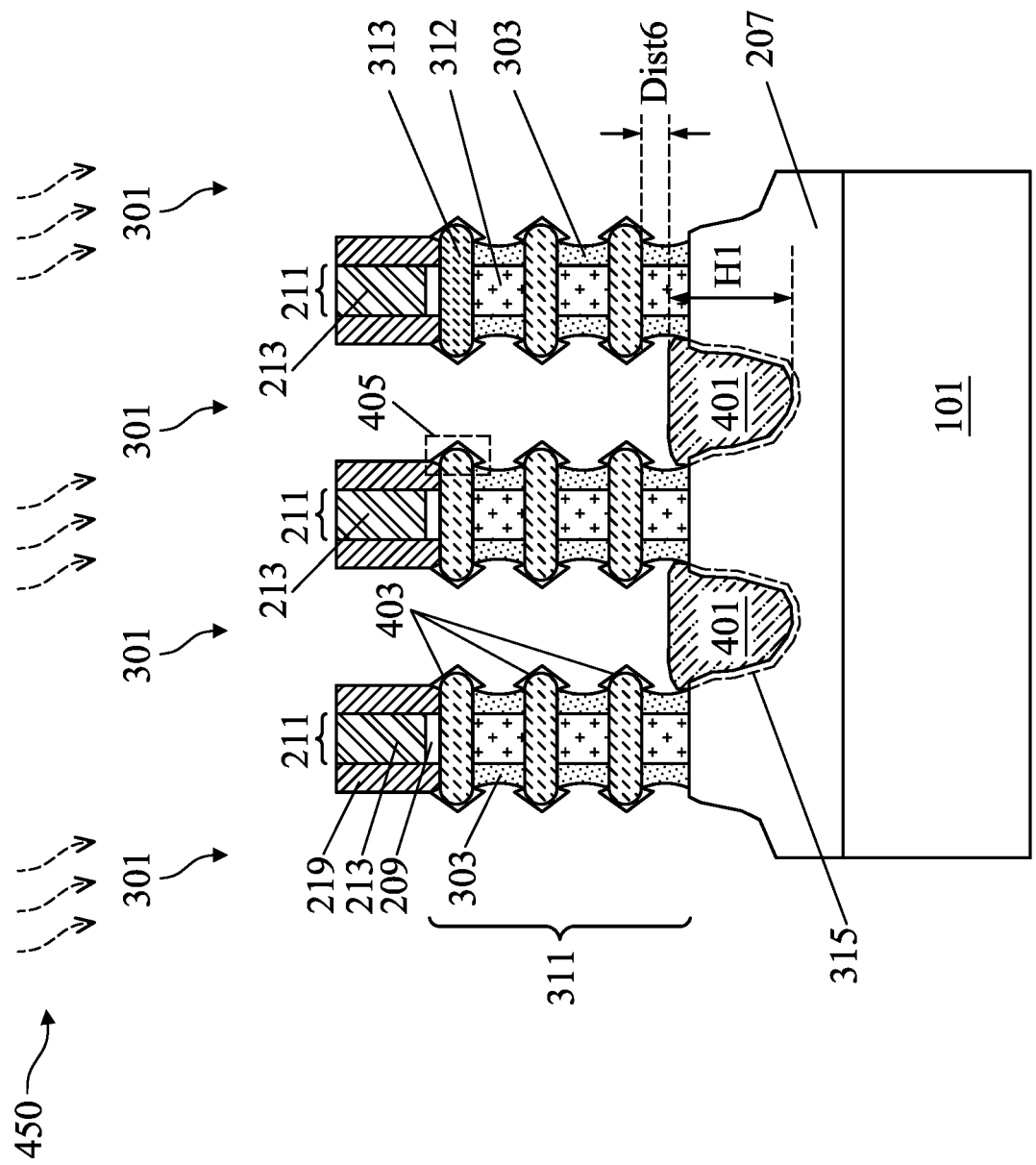
FIG. 4A illustrates a cross-sectional view of a first deposition process used in an intermediate step of forming the source/drain regions of the semiconductor device, in accordance with some embodiments.

FIG. 4A illustrates a cross-sectional view of a first deposition process 450 used in an intermediate step of forming the source/drain regions of the semiconductor device, in accordance with some embodiments. In particular, FIG. 4A illustrates the formation of first source/drain base structures 401 and channel interface structures 403 in the first openings 301, according to some embodiments.

Once the inner spacers 303 have been formed, the first deposition process 450 is performed to form the first source/drain base structures 401 at the bottom of the first openings 301 and to form the channel interface structures 403 along exposed surfaces of the nanostructures 313 at the sidewalls of the first openings 301. According to some embodiments, the first source/drain base structures 401 and the channel interface structures 403 are formed using precursors for silicon (Si) such as silane ($SiH_4$), dichlorosilane ($SiH_2Cl_2$) which may also be referred to herein as DCS, disilane ($Si_2H_6$), or the like. However, other materials such as those materials suitable for forming the second layers 123 such as germane ($GeH_4$), phosphane ($PH_3$), arsane ($AsH_3$), diborane ($B_2H_6$), hydrochloric acid (HCl), the like, or combinations thereof may also be used. The first source/drain base structures 401 and the channel interface structures 403 may be doped or undoped.

According to some embodiments, the first source/drain base structures 401 and the channel interface structures 403 are lightly doped (e.g., a concentration by volume of less than $1\times10^{20}$ $cm^{-3}$) with an n-type dopant (e.g., phosphane ($PH_3$)). However, any suitable n-type dopant may be utilized. In some embodiments, the first source/drain base structures 401 and the channel interface structures 403 are epitaxially grown using a deposition technique such as epitaxial growth, vapor-phase epitaxy (VPE), molecular beam epitaxy (MBE), combinations, or the like. However, any suitable deposition processes may be utilized.

According to some embodiments, the dopants of the first source/drain base structures 401 and the channel interface structures 403 may be placed during the growth of the first source/drain base structures 401 and the channel interface structures 403. For example, the n-type dopant may be placed in situ as the first source/drain base structures 401 and the channel interface structures 403 are being formed. However, any suitable process for placing the dopants within the first source/drain base structures 401 and the channel interface structures 403 may be utilized, and all such processes are fully intended to be included within the scope of the embodiments.

Furthermore, the first deposition process 450 may be controlled such that the first source/drain base structures 401 are epitaxially grown at the bottoms of the first openings 301 to a level above the tops of the parasitic channel 207. By tuning the flow rates of the precursors and process regions used in the first deposition process 450, the channel interface structures 403 may be epitaxially grown from the exposed surfaces of the nanostructures 313 with facet-limited surfaces or with conformal growth surfaces. According to some embodiments, the nanostructures 313 are formed with the first channel profile 307 as described above and the channel interface structures 403 are epitaxially grown from the exposed surfaces of the nanostructures 313 with facet-limited surfaces along the sidewalls of the first openings 301.

According to some embodiments, the deposition process used to form the first source/drain base structures 401 and the channel interface structures 403 may be performed using a process temperature between about 500° C. and about 800° C. In addition, the deposition process used to form the first source/drain base structures 401 and the channel interface structures 403 may be performed using a process pressure between about 5 torr and about 300 torr, in accordance with some embodiments. The gases and/or precursors may be flowed into a processing chamber at a rate between about 10 sccm and about 2000 sccm and for a period of time of between about 50 seconds and about 3000 seconds. Other deposition processes or process parameters may be used. The deposition process is continued until the first source/drain base structures 401 fill the first openings 301 to a level above the tops of the parasitic channels 207 and below the bottommost one of the nanostructure 313 of the nanostructure stacks 311.

Once deposited, an optional etching process (e.g., wet etch) may be performed to recess the first source/drain base structures 401 to a sixth distance Dist6 from the bottommost one of the nanostructures 313 in the first openings 301. According to some embodiments, the sixth distance Dist6 is a distance between about 3 nm and about 20 nm. Once deposited and recessed (if optionally performed), the first source/drain base structures 401 are formed to a first height H1 of between about 3 nm and about 30 nm, in accordance with some embodiments. However, any suitable distance may be used for the sixth distance Dist6 and any suitable height may be used for the first source/drain base structures 401.

According to some embodiments, the optional etching process may be performed using a combination of etches and/or through selectively tuning of the precursors to shape the channel interface structures 403 to a desired configuration. In some embodiments, the optional etching process is used to shape the channel interface structures 403 to be facet-limited shaped. In other embodiments, the optional etching process is used to shape the channel interface structures 403 to be conformally shaped. In other embodiments, the optional etching process is used to remove the channel interface structures 403. According to a particular embodiment in which the nanostructures 313 are formed with the first channel profile 307, the channel interface structures 403 are formed with a first interface profile 405. The first interface profile 405 is facet limited and has a convex shape extending in a radial direction from the distal ends of the nanostructures 313 towards a centerline of the first openings 301.

Figure 4B:
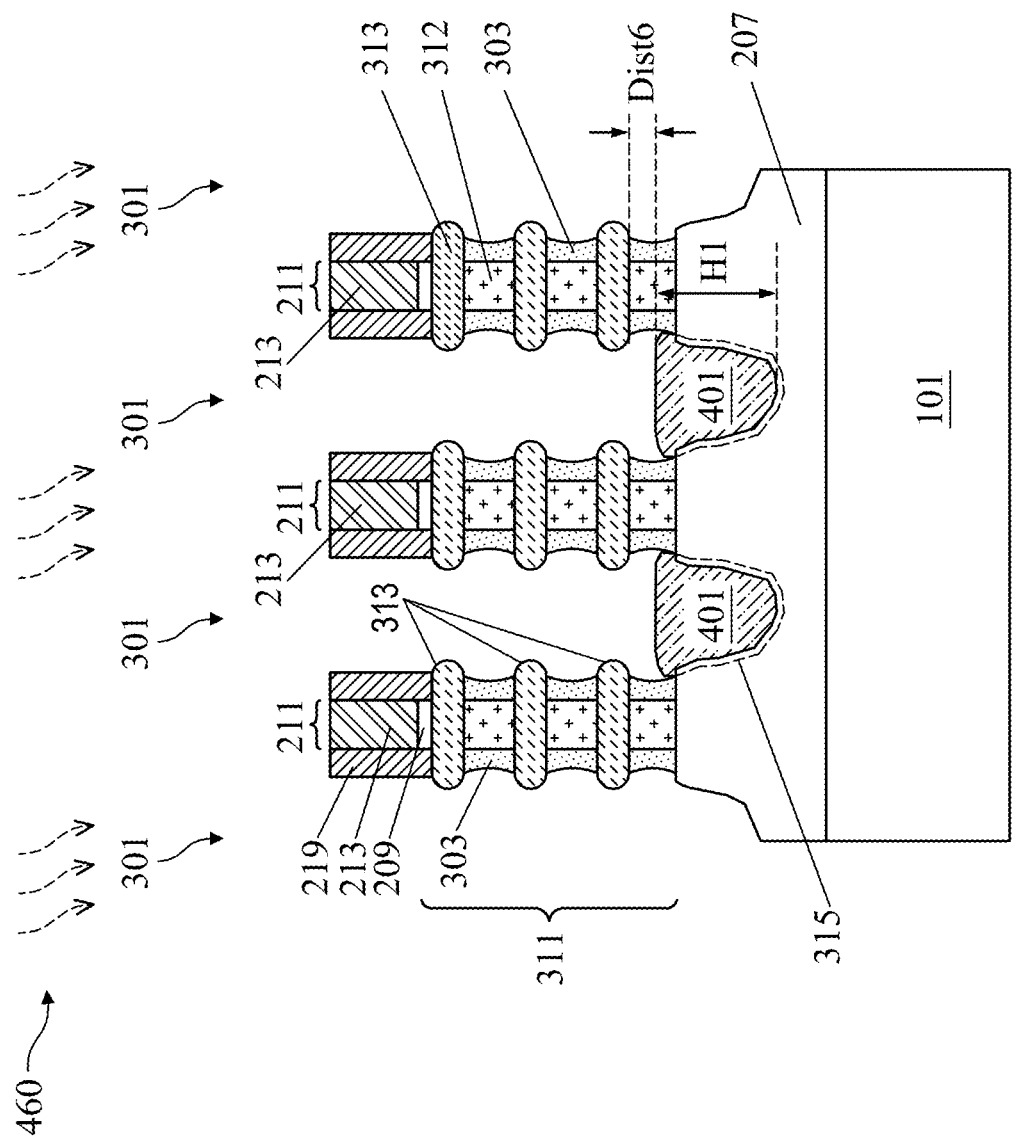
FIG. 4B illustrates a cross-sectional view of an optional removal process used in an intermediate step of forming the source/drain regions of the semiconductor device, in accordance with some embodiments.

FIG. 4B illustrates a cross-sectional view of an optional removal process 460 used in an intermediate step of forming the source/drain regions 501 of the semiconductor device, in accordance with some embodiments. In particular, FIG. 4B illustrates the removal of the channel interface structures 403 from the distal ends of the nanostructures 313, according to some embodiments. The optional removal process 460 may be performed using a combination of etches and/or through selectively tuning of the precursors to remove the channel interface structures 403 based on desired features of the semiconductor device being formed.

According to some embodiments, the optional removal process 460 may be performed using an in-situ etch precursor such as halogen based etchants (e.g., F, Cl, Br, combinations, or the like). The optional removal process 460 may be conducted using an etch on sheet process at a process temperature between about 400° C. and about 800° C., in accordance with some embodiments. Furthermore, the optional removal process 460 may be conducted at a process pressure of between about 1 torr and about 760 torr. However, any suitable temperature and pressure may be utilized.

Figure 5:
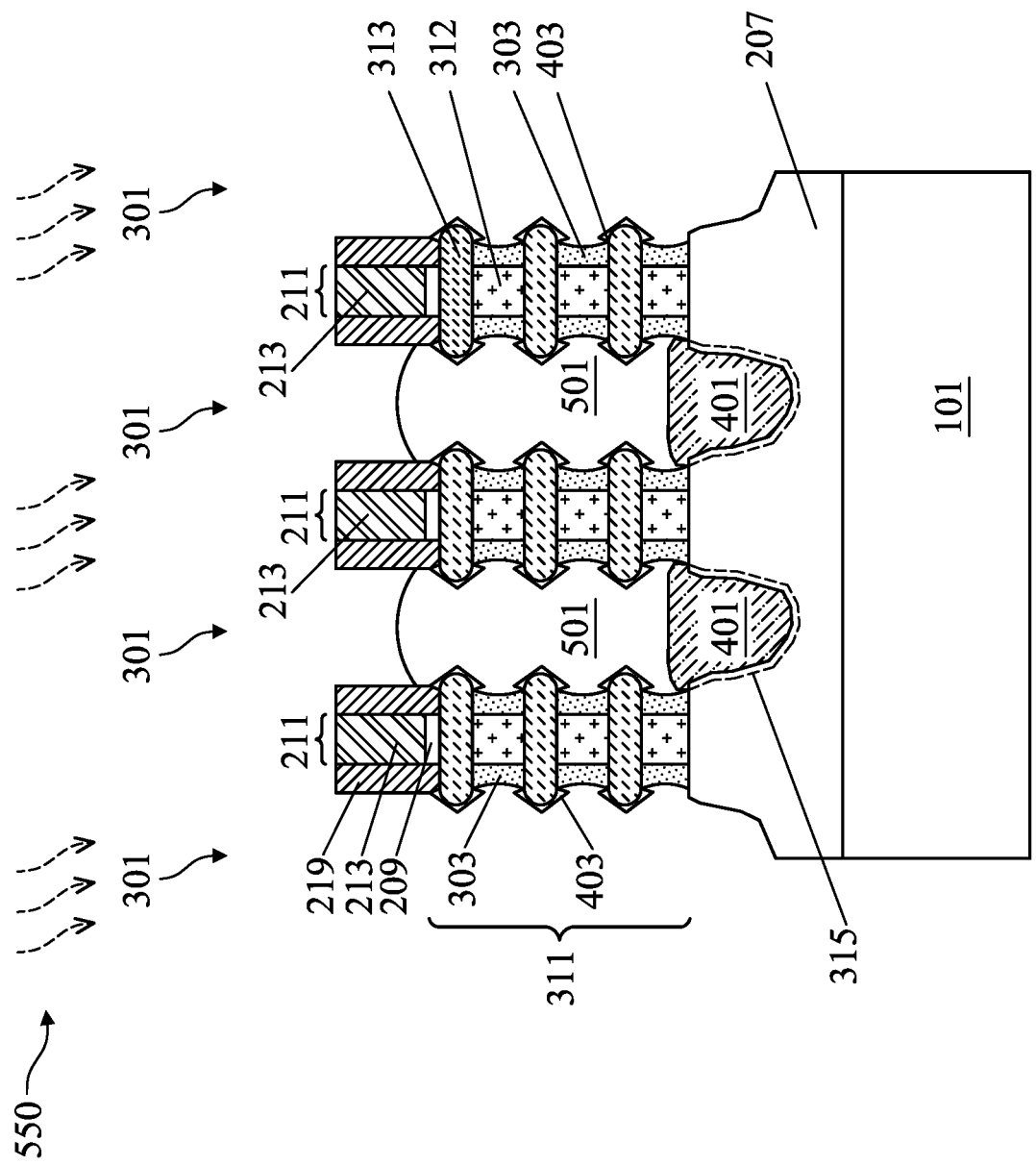
FIG. 5 illustrates a cross-sectional view of a second deposition process used in an intermediate step of forming the source/drain regions of the semiconductor device, in accordance with some embodiments.

FIG. 5 illustrates a cross-sectional view of a second deposition process 550 used in an intermediate step of forming the source/drain regions of the semiconductor device, in accordance with some embodiments. In particular, FIG. 5 illustrates the formation of source/drain regions 501 in the first openings 301, according to some embodiments.

Once the first source/drain base structures 401 and the channel interface structures 403 (if present) have been formed, the second deposition process 550 is performed to form the source/drain regions 501 over the first source/drain base structures 401 and the channel interface structures 403 (if present). According to some embodiments, the source/drain regions 501 are formed using precursors for precursors for silicon (Si) such as silane ($SiH_4$), dichlorosilane ($SiH_2Cl_2$) which may also be referred to herein as DCS, disilane ($Si_2H_6$), or the like. However, other materials such as those materials suitable for forming the second layers 123 may also be used.

In some embodiments, the source/drain regions 501 are epitaxially grown using a deposition technique such as epitaxial growth, vapor-phase epitaxy (VPE), molecular beam epitaxy (MBE), combinations, or the like. In addition, the second deposition process 550 may be conducted at a process temperature between about 400° C. and about 800° C., in accordance with some embodiments. Furthermore, the second deposition process 550 may be conducted at a process pressure of between about 1 torr and about 760 torr. However, any suitable temperature and pressure may be utilized. Furthermore, the second deposition process 550 may be controlled such that the source/drain regions 501 are epitaxially grown from the tops of the first source/drain base structures 401 and from the channel interface structures 403 (if present) to a level above the topmost one of the nanostructure 313 of the nanostructure stacks 311.

According to embodiments, the source/drain regions 501 are heavily doped as compared to the lightly doped materials of the first source/drain base structures 401 and the channel interface structures 403 (if present). In some embodiments, the source/drain regions 501 are heavily doped (e.g., a concentration by volume of greater than about $1\times10^{20}$ cm$^{-3}$) with an n-type dopant (e.g., phosphane ($PH_3$)). However, any suitable n-type dopant may be utilized.

The dopants of the source/drain regions 501 may be placed during the growth of the source/drain regions 501, in accordance with some embodiments. For example, the n-type dopant may be placed in situ as the source/drain regions 501 are epitaxially grown. In other embodiments, the dopants may be placed in the source/drain regions 501 after formation using, for example, a suitable dopant implantation technique. However, any suitable process for placing the dopants within the source/drain regions 501 may be utilized, and all such processes are fully intended to be included within the scope of the embodiments. Furthermore, an anneal process may be performed to activate the dopants within the source/drain regions 501.

Figure 6:
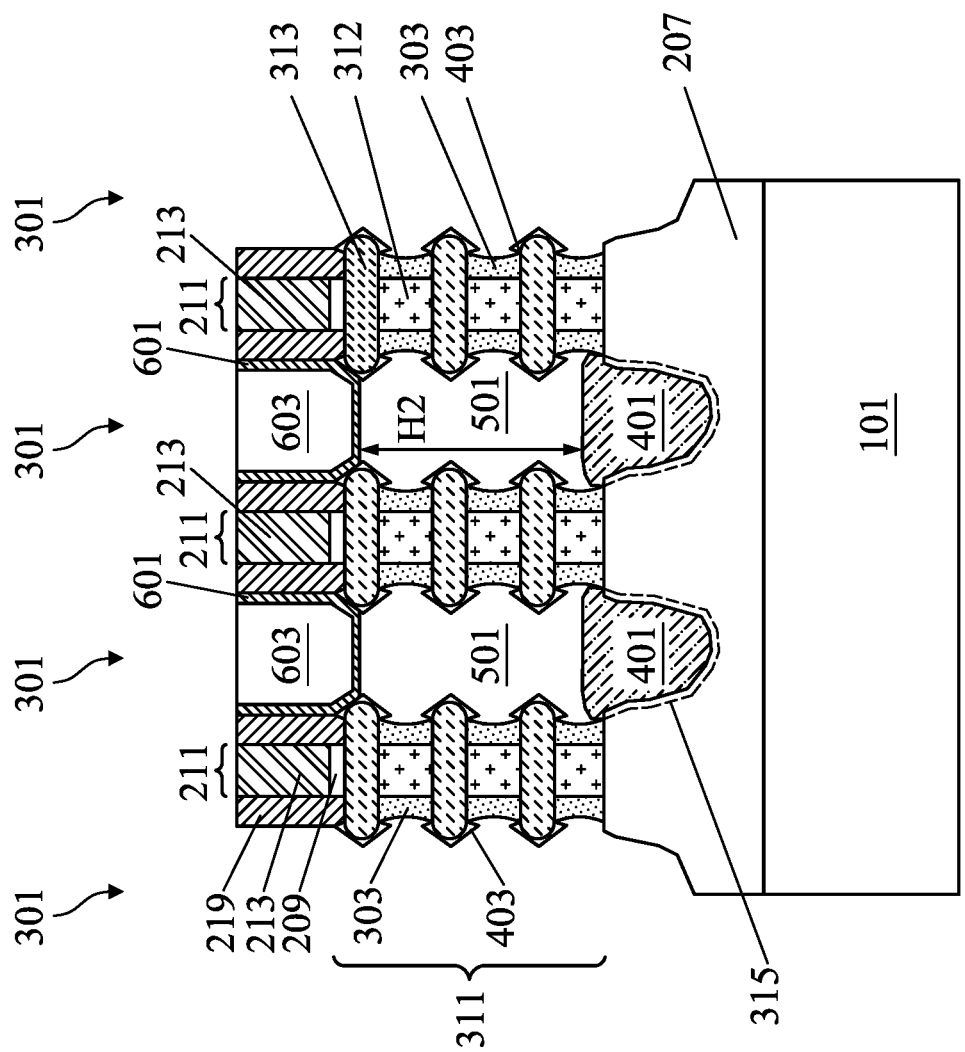
FIG. 6 illustrates a cross-sectional view of the formation of a contact etch stop layer 601 and an interlayer dielectric layer 603 in an intermediate step of forming the semiconductor device, in accordance with some embodiments.

FIG. 6 illustrates a cross-sectional view of an intermediate step in preparation for the eventual formation of the gate contacts and the source/drain contacts of the semiconductor device, in accordance with some embodiments. In particular, FIG. 6 illustrates the formation of a contact etch stop layer 601 and an interlayer dielectric layer 603, in accordance with some embodiments.

Once the material of the source/drain regions 501 has been deposited, an etching process (e.g., wet etch) may be performed to recess and/or planarize the source/drain regions 501 to a second height H2 above the top of the first source/drain base structures 401. According to some embodiments, the second height H2 is a height of between about 3 nm and about 30 nm. However, any suitable height may be used for the source/drain regions 501.

Once the source/drain regions 501 have been formed, the contact etch stop layer 601 is formed over the source/drain regions 501, along sidewalls of the spacers 219, and over the top of the materials exposed on the top of the intermediate structure. The contact etch stop layer 601 functions as an etch stop layer in a subsequent etching process, and may comprise a suitable material such as silicon nitride (SiN), silicon oxynitride (SiON), silicon carbon nitride (SiCN), combinations thereof, or the like, and may be formed by a suitable formation method such as chemical vapor deposition (CVD), physical vapor deposition (PVD), combinations thereof, or the like.

The interlayer dielectric layer 603 is formed over the contact etch stop layer 601 and fills and/or overfills the remaining space in the first openings 301. The interlayer dielectric layer 603 may comprise a material such as silicon dioxide, a low-k dielectric material (e.g., a material having a dielectric constant lower than silicon dioxide), such as silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), $SiO_xC_y$, Spin-On-Glass, Spin-On-Polymers, silicon carbon material, a compound thereof, a composite thereof, the like, or a combination thereof, although any suitable dielectrics may be used. The interlayer dielectric layer 603 may be formed using a process such as plasma enhanced chemical vapor deposition (PECVD), although other processes, such as low pressure chemical vapor deposition (LPCVD), may also be used.

Once formed, the interlayer dielectric layer 603 and the contact etch stop layer 601 may be planarized with the dummy gate electrode 213 and spacers 219 using a planarization process such as chemical mechanical planarization (CMP). However, any suitable planarization process may be utilized. Furthermore, any remaining portions of the first hard mask and/or the second hard mask not previously removed may be removed during the planarization process of the interlayer dielectric layer 603. According to some embodiments, one or more etching processes and/or the chemical mechanical planarization (CMP) may be utilized to remove any remaining portions of the first hard mask and the second hard mask. As such, the dummy gate electrode 213 is exposed after the planarization process.

Figure 7:
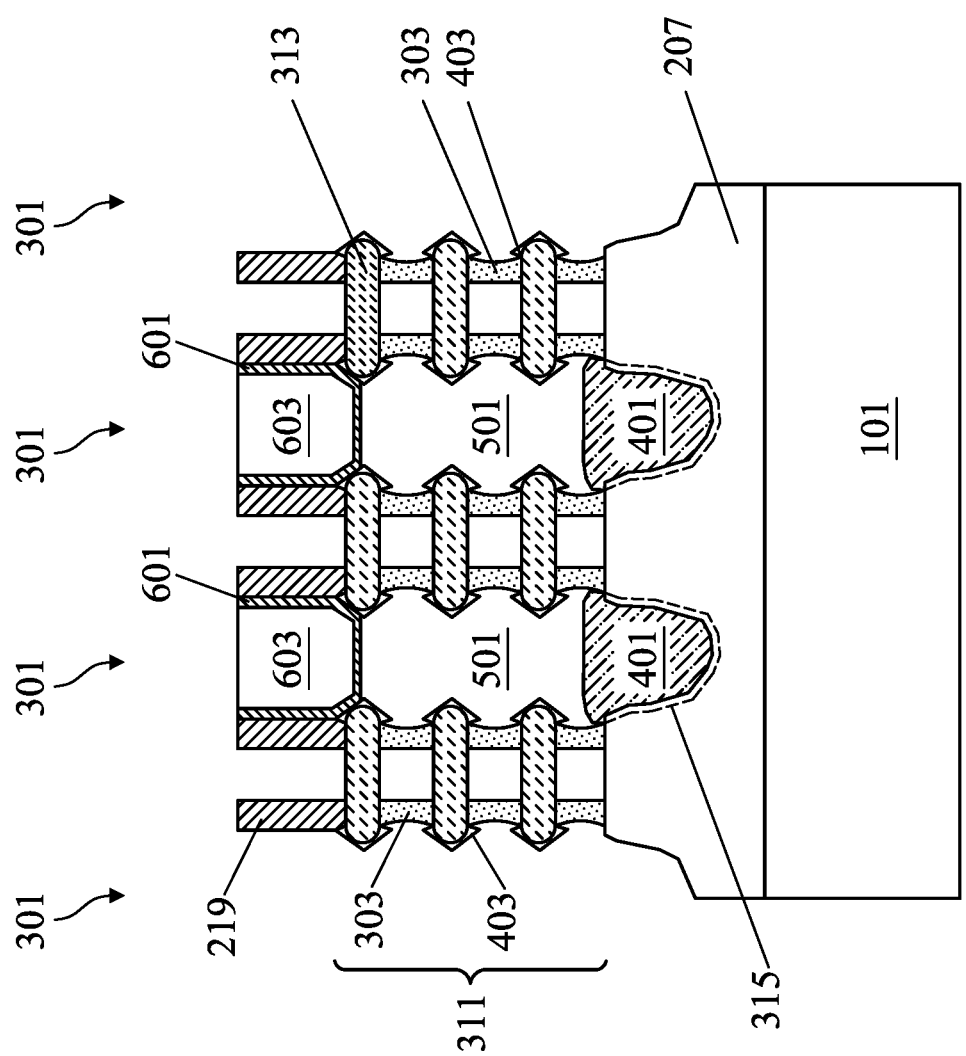
FIG. 7 illustrates a cross-sectional view of a dummy gate removal process in an initial step in forming a gate electrode of the semiconductor device, in accordance with some embodiments.

FIG. 7 illustrates a cross-sectional view of an intermediate step in forming a gate electrode of the semiconductor device, in accordance with some embodiments. In particular, FIG. 7 illustrates the removal of the dummy gate electrodes 213, the dummy gate dielectric 209, and the sacrificial layers 312 in preparation for the eventual formation of a gate electrode, in accordance with some embodiments.

Once exposed, the dummy gate electrodes 213 may be removed in order to expose the underlying dummy gate dielectric 209. In an embodiment the dummy gate electrodes 213 are removed using, e.g., one or more wet or dry etching processes that utilize etchants that are selective to the material of the dummy gate electrodes 213. However, any suitable removal process may be utilized.

Once the dummy gate dielectric 209 has been exposed, the dummy gate dielectric 209 is removed to expose the underlying multilayer channels regions in the patterned multilayer stacks 205 and the portions of the parasitic channels 207. In an embodiment the dummy gate dielectric 209 may be removed using, e.g., a wet etching process that utilizes etchants that are selective to the material of the dummy gate dielectric 209 and substantially less-selective or non-selective to the underlying materials of the nanostructures 313 and the sacrificial layers 312, although any suitable etching process may be utilized.

Once the dummy gate dielectric 209 has been removed, the sides of the sacrificial layers 312 previously covered by the dummy gate dielectric 209 are exposed. As such, the sacrificial layers 312 may be removed from between the substrate 101 and from between the nanostructures 313 in a wire release process step. The wire release process step may also be referred to as a sheet release process step, a sheet formation process step, a nanosheet formation process step or a wire formation process step. In an embodiment the sacrificial layers 312 may be removed using a wet etching process that selectively removes the material of the sacrificial layers 312 (e.g., silicon germanium (SiGe)) without significantly removing the material of the substrate 101 and the material of the nanostructures 313 (e.g., silicon (Si)). However, any suitable removal process may be utilized.

For example, in an embodiment, an etchant such as a high temperature HCl may be used to selectively remove the material of the sacrificial layers 312 (e.g., SiGe) without substantively removing the material of the substrate 101 and/or the material of the nanostructures 313 (e.g., Si). Additionally, the wet etching process may be performed at a temperature of between about 400° C. and about 600° C., and for a time of between about 100 seconds and about 600 seconds. However, any suitable etchant, process parameters, and time can be utilized.

By removing the material of the sacrificial layers 312, the sides of the nanostructures 313 are exposed. The nanostructures 313 are separated from each other by the inner spacers 303. According to some embodiments, the nanostructures 313 are separated by a spacing of between about 5 nm and about 15 nm. The nanostructures 313 comprise the channel regions between opposite ones of the source/drain regions 501 and have a channel length of between about 5 nm and about 180 nm and a channel width of between about 8 nm and about 100 nm. In an embodiment the nanostructures 313 are formed to have the same thicknesses as the original thicknesses of the second layers 123 such as, of between about 3 nm and about 15 nm, although the etching processes may also be utilized to reduce the thicknesses.

Additionally, although FIG. 7 illustrates the formation of three of the nanostructures 313 in the nanostructure stacks 311, any suitable number of the nanostructures 313 may be formed from the nanosheets provided in the multilayer stack 119. For example, the multilayer stack 119 may be formed to include any suitable number of the first layers 121 and any suitable number of the second layers 123. As such, a multilayer stack 119 comprising fewer first layers 121 and fewer second layers 123, after removal of the sacrificial layers 312, forms one or two of the nanostructures 313. Whereas, a multilayer stack 119 comprising many of the first layers 121 and many of the second layers 123, after removal of the sacrificial layers 312, forms four or more of the nanostructures 313.

FIG. 8A illustrates a cross-sectional view of a first semiconductor device 800, in accordance with some embodiments. In particular, FIG. 8A illustrates the formation of a gate dielectric 801, gate electrodes 803, and source/drain contacts 805 according to some embodiments.

In an embodiment the gate dielectric 801 comprises a high-k material (e.g., K>=9) such as $Ta_2O_5$, $Al_2O_3$, Hf oxides, Ta oxides, Ti oxides, Zr oxides, Al oxides, La oxides (e.g., $HfO_2$, HfSiO, HfSiON, HfTaO, HfTiO, HfZrO, LaO, ZrO, TiO), combinations of these, or the like, deposited through a process such as atomic layer deposition, chemical vapor deposition, or the like. In some embodiments, the gate dielectric 801 comprises a nitrogen doped oxide dielectric that is initially formed prior to forming a metal content high-K (e.g., K value>13) dielectric material. The gate dielectric 801 may be deposited to a thickness of between about 1 nm and about 3 nm, although any suitable material and thickness may be utilized. As illustrated, the gate dielectric 801 wraps around the nanostructures 313, thus forming gate-all-around channels between the source/drain regions 501. Furthermore, the channel interface structures 403 between the nanostructures 313 and the source/drain regions 501 serve as lightly doped regions of the gate-all-around channels.

Once the gate dielectric 801 has been formed, the gate electrodes 803 are formed to surround the nanostructures 313 and serve as gate-all-around electrodes of the first semiconductor device 800. In some embodiments, the gate electrodes 803 are formed using multiple layers, each layer deposited sequentially adjacent to each other using a highly conformal deposition process such as atomic layer deposition, although any suitable deposition process may be utilized. According to some embodiments, the gate electrodes 803 may comprise a capping layer, a barrier layer, an n-metal work function layer, a p-metal work function layer, and a fill material.

The capping layer may be formed adjacent to the gate dielectric 801 and may be formed from a metallic material such as TaN, Ti, TiAlN, TiAl, Pt, TaC, TaCN, TaSiN, Mn, Zr, TiN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The metallic material may be deposited using a deposition process such as atomic layer deposition, chemical vapor deposition, or the like, although any suitable deposition process may be used.

The barrier layer may be formed adjacent the capping layer, and may be formed of a material different from the capping layer. For example, the barrier layer may be formed of a material such as one or more layers of a metallic material such as TiN, TaN, Ti, TiAlN, TiAl, Pt, TaC, TaCN, TaSiN, Mn, Zr, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The barrier layer may be deposited using a deposition process such as atomic layer deposition, chemical vapor deposition, or the like, although any suitable deposition process may be used.

The n-metal work function layer may be formed adjacent to the barrier layer. In an embodiment the n-metal work function layer is a material such as W, Cu, AlCu, TiAlC, TiAlN, TiAl, Pt, Ti, TiN, Ta, TaN, Co, Ni, Ag, Al, TaAl, TaAlC, TaC, TaCN, TaSiN, Mn, Zr, other suitable n-type work function materials, or combinations thereof. For example, the first n-metal work function layer may be deposited utilizing an atomic layer deposition (ALD) process, CVD process, or the like. However, any suitable materials and processes may be utilized to form the n-metal work function layer.

The p-metal work function layer may be formed adjacent to the n-metal work function layer. In an embodiment, the first p-metal work function layer may be formed from a metallic material such as W, Al, Cu, TiN, Ti, TiAlN, TiAl, Pt, Ta, TaN, Co, Ni, TaC, TaCN, TaSiN, $TaSi_2$, $NiSi_2$, Mn, Zr, $ZrSi_2$, TaN, Ru, AlCu, Mo, $MoSi_2$, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. Additionally, the p-metal work function layer may be deposited using a deposition process such as atomic layer deposition, chemical vapor deposition, or the like, although any suitable deposition process may be used.

Once the p-metal work function layer has been formed, the fill material is deposited to fill a remainder of the opening. In an embodiment the fill material may be a material such as tungsten, Al, Cu, AlCu, W, Ti, TiAlN, TiAl, Pt, TaC, TaCN, TaSiN, Mn, Zr, TiN, Ta, TaN, Co, Ni, combinations of these, or the like, and may be formed using a deposition process such as plating, chemical vapor deposition, atomic layer deposition, physical vapor deposition, combinations of these, or the like. However, any suitable material may be utilized.

Once the openings left behind by the removal of the dummy gate electrodes 213 have been filled, the materials of the gate electrodes 803 and the gate dielectric 801 may be planarized in order to remove the materials of the gate electrodes 803 and the gate dielectric 801 that is outside of the openings. In a particular embodiment the removal may be performed using a planarization process such as chemical mechanical polishing, although any suitable planarization and removal process may be utilized.

Once formed, an optional recessing process may be performed to recess the gate electrodes 803 below the planarized surfaces of the interlayer dielectric layer 603. The optional recessing process may be performed using an etching process such as a wet etch, a dry etch, combinations, or the like. Once recessed, optional gate caps (not shown) may be formed in the recesses by initially depositing a dielectric material over the gate electrodes 803 to fill and/or overfill the recesses. In some embodiments, the optional gate caps are formed using a dielectric material such as a silicon nitride (SiN), oxide (OX), silicon oxynitride (SiON), silicon oxycarbonitride (SiOCN), silicon carbonitride (SiCN), or the like. According to some embodiments, the optional gate caps are formed using a metal oxide of materials such as zirconium (Zr), hafnium (Hf), aluminium (Al), or the like. Furthermore, the optional gate caps may be formed using a suitable deposition process such as chemical vapor deposition (CVD), atomic layer deposition (ALD), physical vapor deposition (PVD), combinations of these, or the like. However, any suitable materials and deposition processes may be utilized. Once deposited, the optional gate caps may be planarized, the spacers 219, the contact etch stop layer 601, and the interlayer dielectric layer 603 using a planarization process such as a chemical mechanical polishing process.

FIG. 8A further illustrates the formation of source/drain contacts 805 for connectivity to the source/drain regions 501, in accordance with some embodiments. Once the interlayer dielectric layer 603 has been formed, the source/drain contacts 805 may be formed through the interlayer dielectric layer 603 and the contact etch stop layer 601 to make electrical connection to the source/drain regions 501. In an embodiment the source/drain contacts 805 may be formed by initially forming openings through the interlayer dielectric layer 603 and the contact etch stop layer 601 in order to expose the source/drain regions 501. The openings may be formed using, e.g., a suitable photolithographic masking and etching process.

According to some embodiments, an optional silicidation process may be performed using appropriate materials such as titanium, nickel, cobalt, or erbium in order to reduce the Schottky barrier height of the source/drain contacts 805. However, other metals, such as platinum, palladium, and the like, may also be used for the optional silicidation process. In some embodiments, the optional silicidation process is performed using a blanket deposition of an appropriate metal layer in the openings and over the exposed areas of the source/drain regions 503. The blanket deposition is followed by an annealing step which causes the metal layer to react with the underlying exposed material (e.g., silicon) of the source/drain regions 503. Un-reacted metal is then removed, such as with a selective etch process. According to some embodiments, the optional silicide contacts are formed to a thickness of between about 5 nm and about 50 nm. However, any suitable thickness may be used.

The source/drain contacts 805 may be formed by depositing a conductive material such as W, Al, Cu, Co, Ti, Ta, Ru, TiN, TiAl, TiAlN, TaN, TaC, NiSi, CoSi, combinations of these, or the like, into the openings and over the exposed areas of the source/drain regions 501 or over the optional silicide contacts (if present). The conductive material may be deposited using a process such as sputtering, chemical vapor deposition, electroplating, electroless plating, or the like, to fill and/or overfill the openings. Once filled or overfilled, any conductive material deposited outside of the openings may be removed using a planarization process such as chemical mechanical polishing (CMP). However, any suitable deposition process and planarization process may be utilized.

Further interlayer dielectric layers (not individually illustrated) and conductive features (also not individually illustrated) may be formed over the gate electrodes 803 and/or the source/drain contacts 805 to provide further external connectivity to the first semiconductor device 800. Examples of further conductive features include but are not limited to, conductive vias, contact plugs, redistribution layers, contact traces, integrated passive devices, under bump metallization layers, and external contacts. However, any suitable dielectric layers and/or conductive features may be utilized and all such features are fully intended to be included within the scope of the embodiments.

FIG. 8A further illustrates a cutline B-B taken through the first semiconductor device 800. Cutline B-B represents a vertical cut taken through the center of the gate electrode 803, the nanostructures 313, the parasitic channel 207, and the substrate 101. The cutline B-B is oriented perpendicular to the lengths of the nanostructures 313 and the parasitic channel 207 and is used in reference with the following figures and descriptions.

Figure 8B:
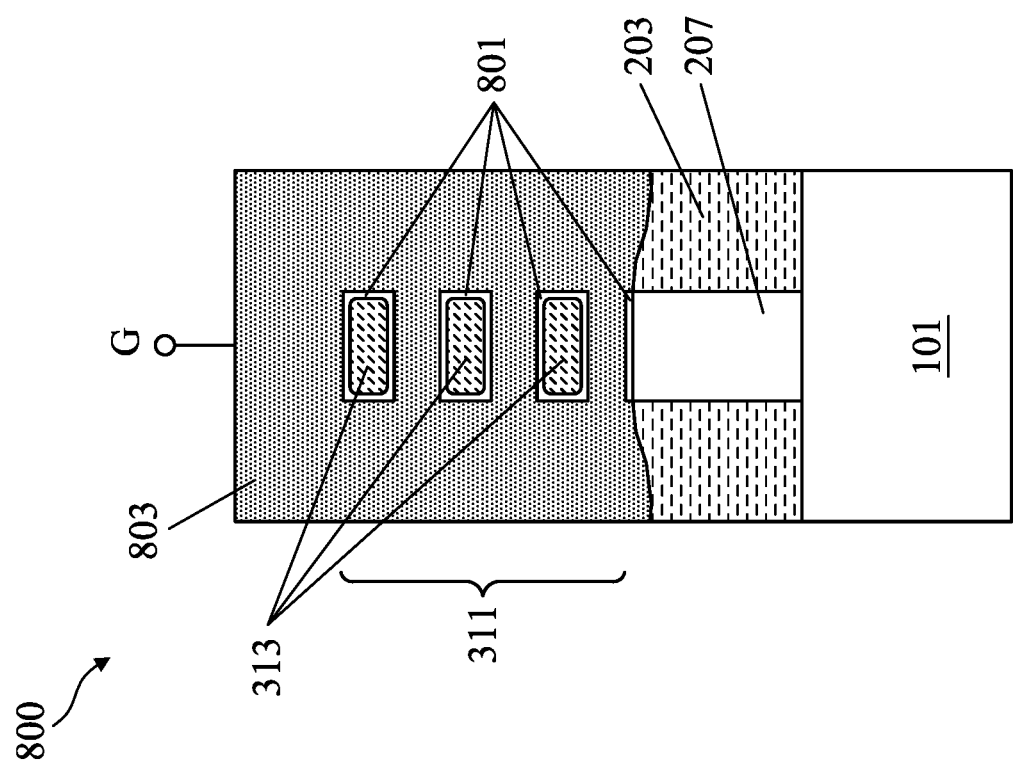

FIG. 8B illustrates a cross-sectional view through the vertical cutline B-B of the first semiconductor device 800 illustrated in FIG. 8A. In particular, FIG. 8B illustrates the nanostructure stacks 311 disposed over the parasitic channel 207 and the substrate 101. FIG. 8B further illustrates the gate dielectric 801 surrounding each of the nanostructures 313 and overlying the parasitic channel 207. As such, the nanostructures 313 serve as gate-all-around channels of the first semiconductor device 800. FIG. 8B further illustrates the gate electrode 803 disposed over the isolation regions 203 and over and surrounding the gate dielectric 801. As such, the gate electrode 803 serves as a gate-all-around electrode of the first semiconductor device 800.

Figure 8C:
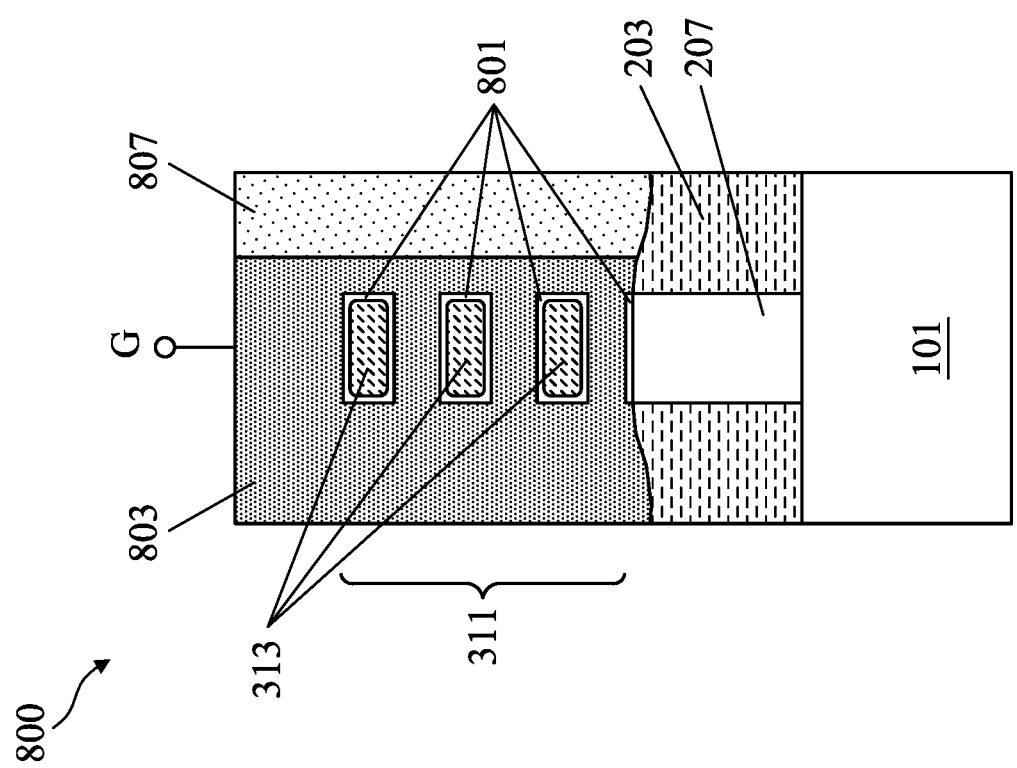
FIG. 8C illustrates cross-sectional view of forming a cut-metal-gate structure in the first semiconductor device, in accordance with some embodiments.

FIG. 8C illustrates, according to some embodiments, an optional cut-metal-gate structure 807 formed through the gate electrode 803 of the first semiconductor device 800 illustrated in FIG. 8B. As such, the optional cut-metal-gate structure 807 separates the gate electrode 803 in two (with only one being illustrated in FIG. 8C) and isolates a first part of the gate electrode 803 from a second part of the gate electrode 803. The first part of the gate electrode 803 remains over the nanostructures 313, the gate dielectric 801 and the parasitic channel 207 and may be referred to as an isolated gate electrode. According to some embodiments, the second part of the gate electrode 803 remains over the nanostructures 313, the gate dielectrics 801 and the parasitic channels 207 formed from other multi-layer fins (illustrated in FIG. 1) and may be referred to as a shared gate electrode or a common gate electrode. In still other embodiments, another optional cut-metal-gate structure 807 may be formed through the second part of the gate electrode 803 separating the second part of the gate electrode 803 into two further isolated gate electrodes being disposed over respective ones of the nanostructures 313, the gate dielectrics 801 and the parasitic channels 207 formed from the other multilayer fins.

According to some embodiments, the optional cut-metal-gate structure 807 may be formed by initially forming an opening in a desired location for the optional cut-metal-gate structure 807. The opening may be formed using a masking layer and an etching process (e.g., anisotropic etching process). The etching process may be configured to stop on the top surface of the gate dielectrics 801 and/or the top surface of the isolation regions 203. The openings may be formed between adjacent ones of the parasitic channels 207 and may be formed to cut through one or more gate electrodes 803.

Once the openings have been formed, the optional cut-metal-gate structure 807 is formed by initially depositing a dielectric material to fill and/or overfill the openings. In accordance with some embodiments, the optional cut-metal-gate structures 807 are formed using a dielectric material such as a silicon nitride (SiN), oxide (OX), silicon oxynitride (SiON), silicon oxycarbonitride (SiOCN), silicon carbonitride (SiCN), or the like. According to some embodiments, the optional cut-metal-gate structures 807 are formed using a metal oxide of materials such as zirconium (Zr), halfnium (Hf), aluminium (Al), or the like. Furthermore, the optional cut-metal-gate structures 807 may be formed using a suitable deposition process such as chemical vapor deposition (CVD), atomic layer deposition (ALD), physical vapor deposition (PVD), combinations of these, or the like. However, any suitable materials and deposition processes may be utilized. Once the openings have been filled, the materials of the optional cut-metal-gate structures 807 may be planarized using a planarization process (e.g., chemical mechanical polishing process) in order to remove any material that is outside of the openings. According to some embodiments, the optional cut-metal-gate structures 807 are formed to a width of between about 5 nm and about 50 nm. However, any suitable widths may be used.

Additionally, while a cut-metal gate process is described above in which the materials for the metal gate are deposited and then patterned, this is intended to be illustrative and is not intended to be limiting. Rather, any suitable process, such as forming the cut-metal-gate structure 807 prior to removal of the dummy gate electrode 213 and then forming the materials for the gate electrode 803 after formation of the cut-metal-gate structure 807 may also be utilized. All such processes are fully intended to be included within the scope of the embodiments.

Figure 9:
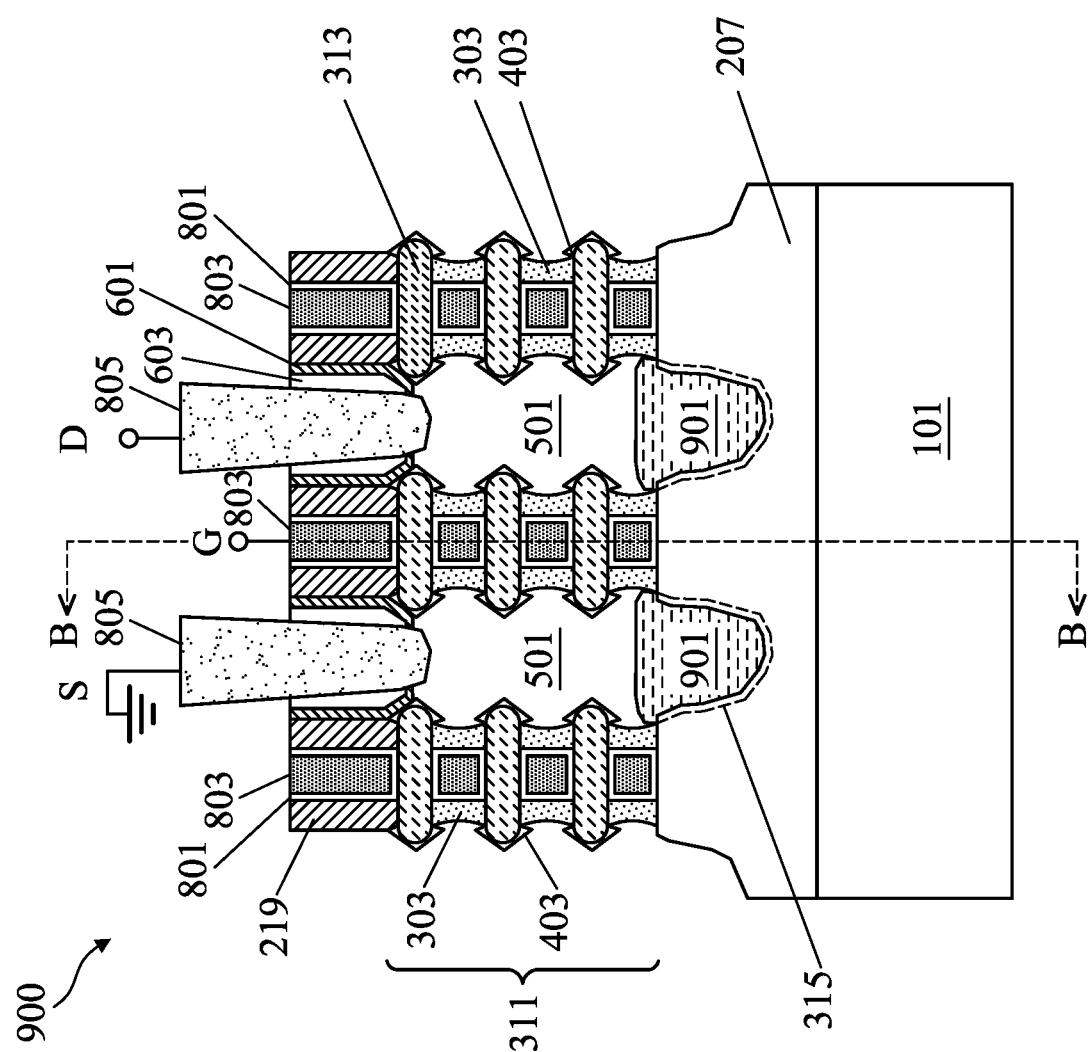
FIG. 9 illustrates a cross-sectional view of a second semiconductor device, in accordance with some other embodiments.

Turning to FIG. 9, in accordance with other embodiments, this figure illustrates a cross-sectional view of a second semiconductor device 900. The second semiconductor device 900 is similar to the first semiconductor device 800

(shown in FIGS. 8A-8C); however, the second semiconductor device 900 comprises second source/drain base structures 901 instead of the first source/drain base structures 401. According to some embodiments, the second source/drain base structures 901 are formed as non-doped silicon regions.

According to some embodiments, the second source/drain base structures 901 are formed using precursors for silicon (Si) such as silane ($SiH_4$), dichlorosilane ($SiH_2Cl_2$) or DCS, disilane ($Si_2H_6$), or the like. However, other materials such as those materials suitable for forming the second layers 123 may also be used. The second source/drain base structures 901 are undoped. In some embodiments, the second source/drain base structures 901 are epitaxially grown using a deposition technique such as epitaxial growth, vapor-phase epitaxy (VPE), molecular beam epitaxy (MBE), combinations, or the like. In embodiments where the second source/drain base structures 901 are formed in the second semiconductor device 900, the channel interface structures 403 may be undoped during formation and may then be doped through diffusion processes during or after formation of the source/drain regions 501.

Figure 10:
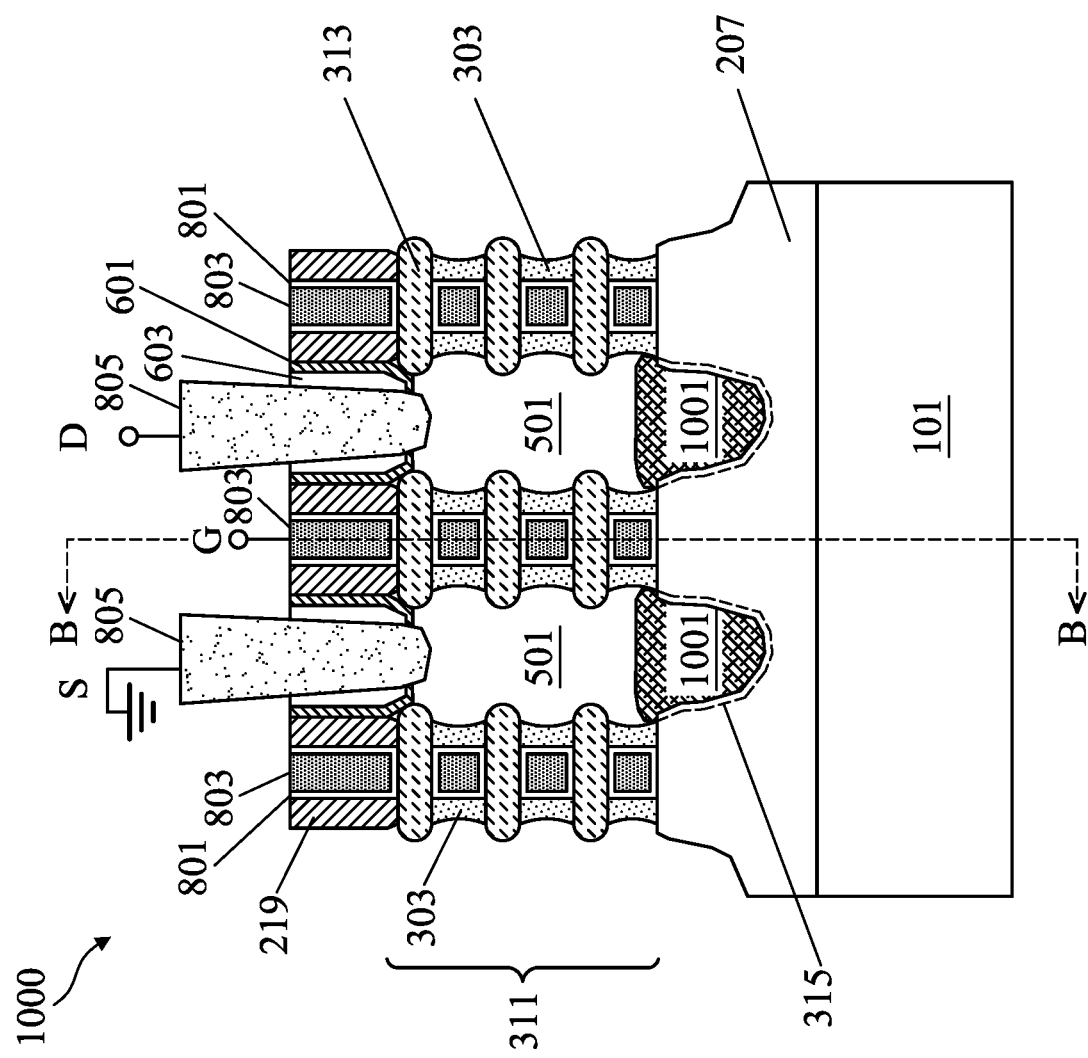
FIG. 10 illustrates a cross-sectional view of a third semiconductor device, in accordance with still further embodiments.

Continuing to FIG. 10, in accordance with still other embodiments, this figure illustrates a cross-sectional view of a third semiconductor device 1000. The third semiconductor device 1000 is similar to the first semiconductor device 800; however, the third semiconductor device 1000 comprises third source/drain base structures 1001 instead of the first source/drain base structures 401. According to some embodiments, the third source/drain base structures 1001 are formed as counter-doped regions with dopants that have an opposite conductivity (e.g., p-doped). In embodiments where the third source/drain base structures 1001 are formed in the third semiconductor device 1000, the channel interface structures 403 may be initially formed with the p-type dopants. Once formed with the p-type dopants, the channel interface structures 403 may be removed using the optional removal process 460, as discussed above with regard to FIG. 4B.

According to some embodiments, the third source/drain base structures 1001 and the channel interface structures 403 are formed using precursors for silicon (Si) such as silane ($SiH_4$), dichlorosilane ($SiH_2Cl_2$) or DCS, disilane ($Si_2H_6$), or the like and are counter-doped (e.g., p-type dopant) as compared to the dopant (e.g., n-type dopant) used for the source/drain regions 501. However, other materials such as those materials suitable for forming the third source/drain base structures 1001 may also be used.

In some embodiments, the third source/drain base structures 1001 and the channel interface structures 403 (if formed and prior to removal) are lightly doped (e.g., a concentration by volume of less than $1 \times 10^{21}$ cm$^{-3}$) with a p-type dopant such as boron hydride (e.g., diborane $B_2H_6$). However, any suitable p-type dopant may be utilized. In some embodiments, the third source/drain base structures 1001 and the channel interface structures 403 (if formed) are epitaxially grown using a deposition technique such as epitaxial growth, vapor-phase epitaxy (VPE), molecular beam epitaxy (MBE), combinations, or the like.

Figure 11:
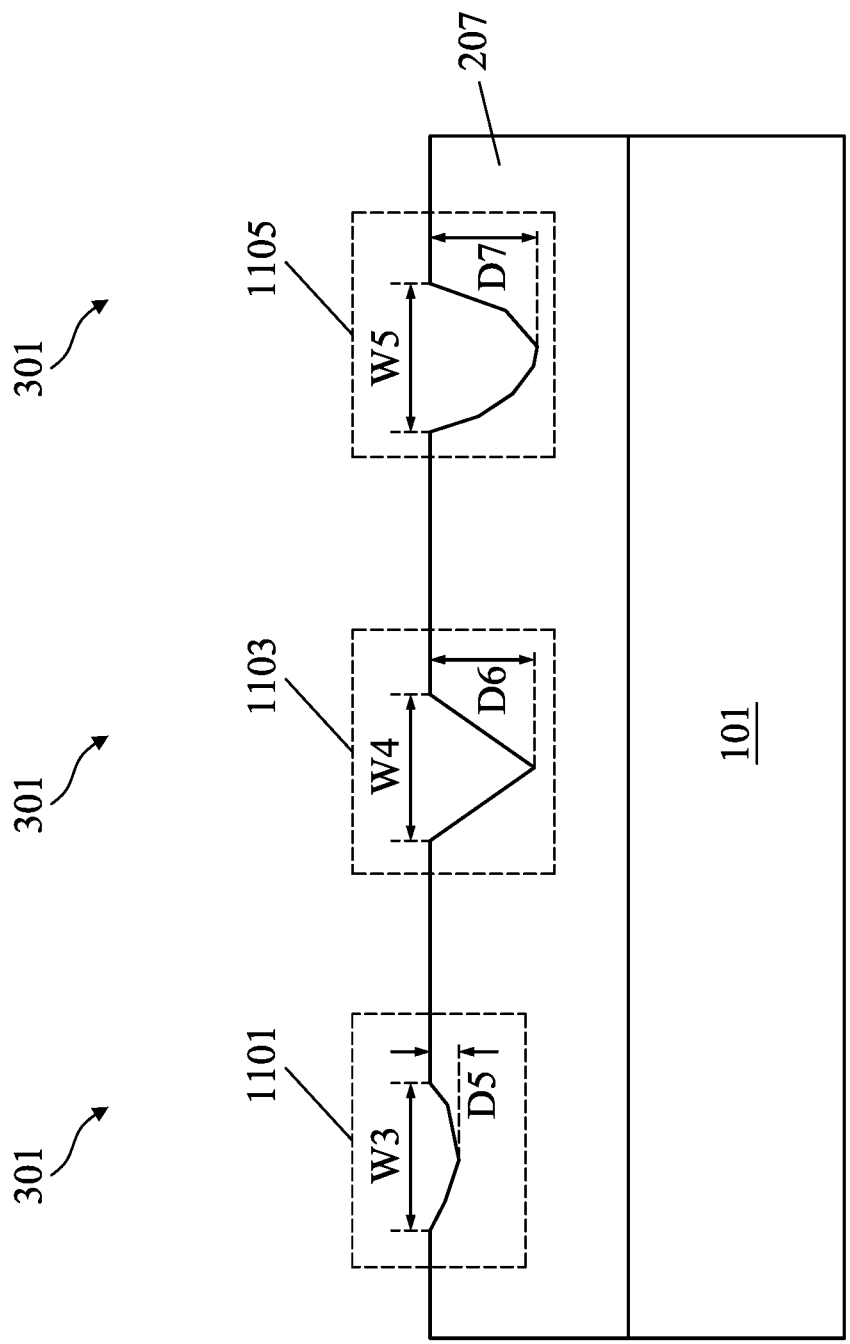
FIG. 11 illustrates a cross-sectional view of three recess profiles, according to different embodiments, that may be formed at the bottom of a first opening in an initial step of forming a source/drain region for the semiconductor device, in accordance with some embodiments.

FIG. 11 illustrates three different embodiments of recess profiles that may be formed at the bottom of the first openings 301 in the parasitic channel 207 using anisotropic wet chemical etches, anisotropic dry etches, isotropic dry etches, combinations, or the like and may be performed using any suitable process conditions (e.g., temperatures, flow rates, pressures, and/or times). Additionally, while the first openings with different shapes have been shown in FIG. 11 as being formed on the same substrate 101, this is merely for convenience, as different processes will form different shapes. Of course, if desired, one portion of the substrate 101 may be masked while a first one of the first openings 301 is formed and then a separate process may be used to form a second shape while the first shape is masked. Any suitable combination of shapes may be utilized.

The anisotropic wet chemical etches use solutions such as potassium hydroxide (KOH), tetra-methyl ammonium (TMAH) and ethylene di-amine pyrocatechol (EDP) in a wet etching process such as a dip process, a spray process, a spin-on process, or the like. The anisotropic dry etches use plasmas sources such as $CF_4$, $CH_3F$, HBr, $O_2$, He, Ar, combinations, or the like and are performed with a bias power. The isotropic dry etches use plasma sources such as $NF_3$, $CL_2$, $H_2$, Ar, He, combinations, or the like and are performed with a bias power. In particular, FIG. 11 illustrates a second recess profile 1101, a third recess profile 1103, and a fourth recess profile 1105, according to several different embodiments.

In a particular embodiment, the second recess profile 1101 may be formed at the bottom of the first openings 301 and into the parasitic channel 207 using an anisotropic wet etch in a solution such as potassium hydroxide (KOH). The anisotropic wet etch may be performed, according to some embodiments, using a wet dip technique, at a suitable process temperature (e.g., between about 400° C. and about 600° C.) and a suitable process time (e.g., between about 100 seconds and about 1000 seconds). However, any suitable temperatures and times may be utilized. According to some embodiments, the second recess profile 1101 is formed with a shallow rounded profile having a third width W3 of between about 3 nm and about 100 nm and a fifth depth D5 that is less than the third width W3. However any suitable width and depth may be utilized to form the second recess profile 1101.

According to another embodiment, the third recess profile 1103 may be formed at the bottom of the first openings 301 and into the parasitic channel 207 using an isotropic dry etch and an $NF_3$ plasma source, in accordance with some embodiments. The isotropic dry etch, according to some embodiments, may be performed using a plasma etch technique at suitable process conditions such as a temperature between about 400° C. and about 600° C. and a suitable flow rate for a process time of between about 100 seconds and about 1000 seconds. However, any suitable process conditions may be utilized. According to some embodiments, the third recess profile 1103 is formed with a pointed profile having a fourth width W4 of between about 3 nm and about 100 nm and a sixth depth D6 of between about 0 nm and about 80 nm. However any suitable width and depth may be utilized to form the third recess profile 1103.

According to still further embodiments, the fourth recess profile 1105 may be formed at the bottom of the first openings 301 and in the parasitic channel 207 using an anisotropic dry etch and a $CF_4$ plasma source, in accordance with some embodiments. The anisotropic dry etch, according to some embodiments, may be performed using a plasma etch technique at suitable process conditions such as a temperature between about 400° C. and about 600° C., a suitable flow rate for a process time of between about 100 seconds and about 1000 seconds using a suitable bias voltage. However, any suitable process conditions may be utilized. According to some embodiments, the fourth recess profile 1105 is formed with a deep rounded profile having a fifth width W5 of between about 3 nm and about 100 nm and a seventh depth D7 of between about 0 nm and about 80 nm.

However any suitable width and depth may be utilized to form the fourth recess profile 1105.

Figure 12:
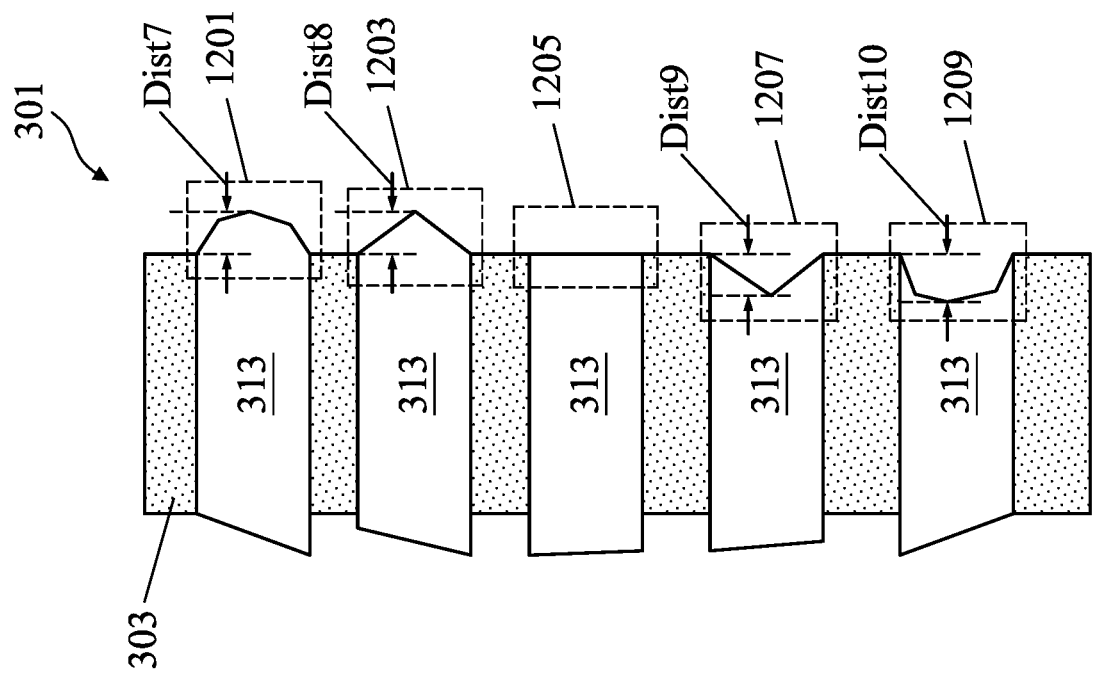
FIG. 12 illustrates a cross-sectional view of five channel profiles, according to different embodiments, that may be shaped at distal ends of nanostructures during a recess etching process, according to some embodiments.

FIG. 12 illustrates five different embodiments of channel profiles that may be shaped at distal ends of the nanostructures 313 during the recess etching process 350 as discussed above with regard to FIG. 3. A great variety of channel profiles may be formed using anisotropic wet chemical etches, anisotropic dry etches, isotropic dry etches, combinations, or the like using the materials and by controlling the process conditions (e.g., precursors, temperatures, flow rates, pressures, bias powers, and/or times). In particular, FIG. 12 illustrates a second channel profile 1201, a third channel profile 1203, a fourth channel profile 1205, a fifth channel profile 1207, and a sixth channel profile 1209, according to the five different embodiments. Additionally, while the channel profiles with different shapes have been shown in FIG. 12 as being formed over each other, this is merely for convenience, as different processes will form different shapes.

The anisotropic wet chemical etches use solutions such as potassium hydroxide (KOH), tetra-methyl ammonium (TMAH) and ethylene di-amine pyrocatechol (EDP) in a wet etching process such as a dip process, a spray process, a spin-on process, or the like. The anisotropic dry etches use plasmas sources such as $CF_4$, $CH_3F$, HBr, $O_2$, He, Ar, combinations, or the like and are performed with a bias power. The isotropic dry etches use plasma sources such as $NF_3$, $CL_2$, $H_2$, Ar, He, combinations, or the like and are performed with a bias power. However, any suitable combinations of etchants may be used.

In a particular embodiment, the second channel profile 1201 may be formed at the exposed distal ends of the nanostructures 313 at the sidewalls of the first openings 301 using an anisotropic wet etch in a solution such as potassium hydroxide (KOH). The anisotropic wet etch may be performed, according to some embodiments, using a wet dip technique, at a suitable process temperature (e.g., between about 400° C. and about 600° C.) and a suitable process time (e.g., between about 100 seconds and about 1000 seconds). However, any suitable temperatures and times may be utilized. According to some embodiments, the second channel profile 1201 is formed with a rounded convex shaped profile extending towards a centerline of the first openings 301 a seventh distance Dist7 being between about 0 nm and about 15 nm. However any suitable distance may be utilized to form the second channel profile 1201.

In another embodiment, the third channel profile 1203 may be formed at the exposed distal ends of the nanostructures 313 at the sidewalls of the first openings 301 using an isotropic dry etch using, e.g., $NF_3$. The isotropic dry etch may be performed, according to some embodiments, using plasma a generation technique, at a suitable process temperature (e.g., between about 400° C. and about 600° C.) and a suitable process time (e.g., between about 100 seconds and about 1000 seconds). However, any suitable temperatures and times may be utilized. According to some embodiments, the third channel profile 1203 is formed with a pointed shaped profile extending towards a centerline of the first openings 301 an eighth distance Dist8 being between about 0 nm and about 15 nm. However any suitable distance may be utilized to form the third channel profile 1203.

In another embodiment, the fourth channel profile 1205 may be formed at the exposed distal ends of the nanostructures 313 at the sidewalls of the first openings 301 using an anisotropic dry etch with an etchant such as $CH_4$. The isotropic dry etch may be performed, according to some embodiments, using a plasma generation technique, at a suitable process temperature (e.g., between about 400° C. and about 600° C.) and a suitable process time (e.g., between about 100 seconds and about 1000 seconds). However, any suitable temperatures and times may be utilized. According to some embodiments, the fourth channel profile 1205 is formed using a reactive ion etching (RIE) with a flat profile that is coterminous with the sidewalls of the first openings 301. However any suitable distance may be utilized to form the fourth channel profile 1205.

In still another embodiment, the fifth channel profile 1207 may be formed at the exposed distal ends of the nanostructures 313 at the sidewalls of the first openings 301 using an isotropic dry etch using a plasma source such as ($NF_3$). The isotropic dry etch may be performed, according to some embodiments, using a plasma generation technique, at a suitable process temperature (e.g., between about 400° C. and about 600° C.) and a suitable process time (e.g., between about 100 seconds and about 1000 seconds). However, any suitable temperatures and times may be utilized. According to some embodiments, the fifth channel profile 1207 is formed with a pointed shaped profile recessed away from a centerline of the first openings 301 an ninth distance Dist9 being between about 0 nm and about 15 nm. However any suitable distance may be utilized to form the fifth channel profile 1207.

In yet another embodiment, the sixth channel profile 1209 may be formed at the exposed distal ends of the nanostructures 313 at the sidewalls of the first openings 301 using an isotropic dry etch with an etchant such as $NF_3$. The isotropic dry etch may be performed, according to some embodiments, using a plasma generation technique, at a suitable process temperature (e.g., between about 400° C. and about 600° C.) and a suitable process time (e.g., between about 100 seconds and about 1000 seconds). However, any suitable temperatures and times may be utilized. According to some embodiments, the sixth channel profile 1209 is formed with a rounded concave shaped profile recessed away from a centerline of the first openings 301 a tenth distance Dist10 being between about 0 nm and about 15 nm. However any suitable distance may be utilized to form the sixth channel profile 1209.

Figure 13A:
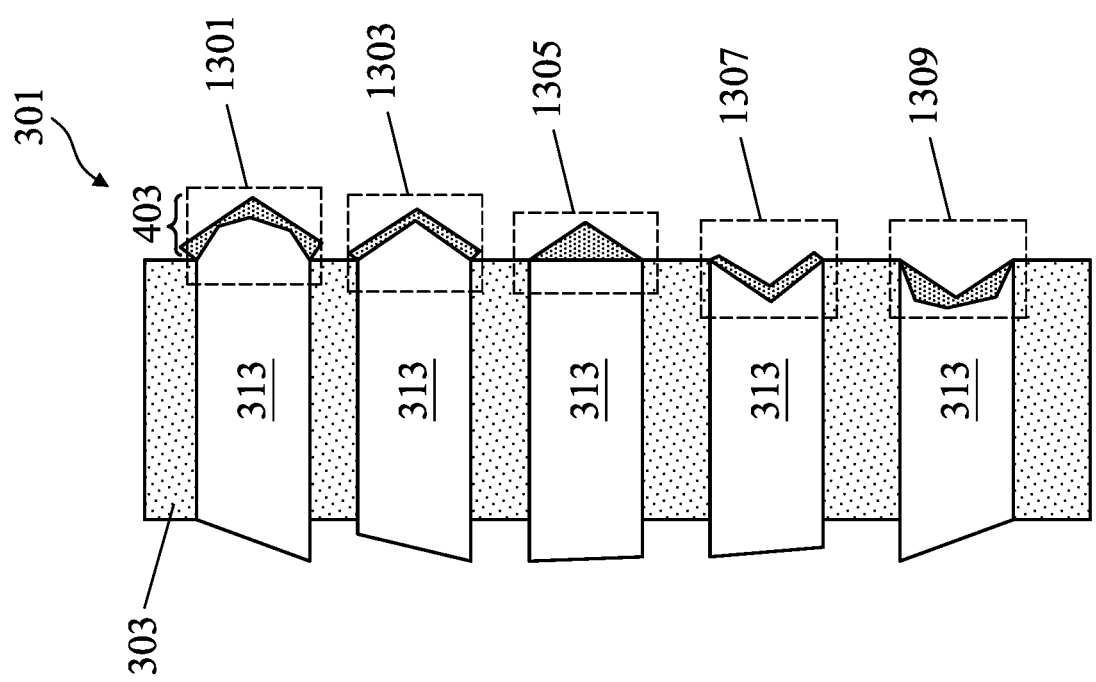
FIG. 13A-13B illustrate cross-sectional views of ten channel interface structures, according to different embodiments, that may be formed and shaped at distal ends of nanostructures during a deposition process, according to some embodiments.
Figure 13B:
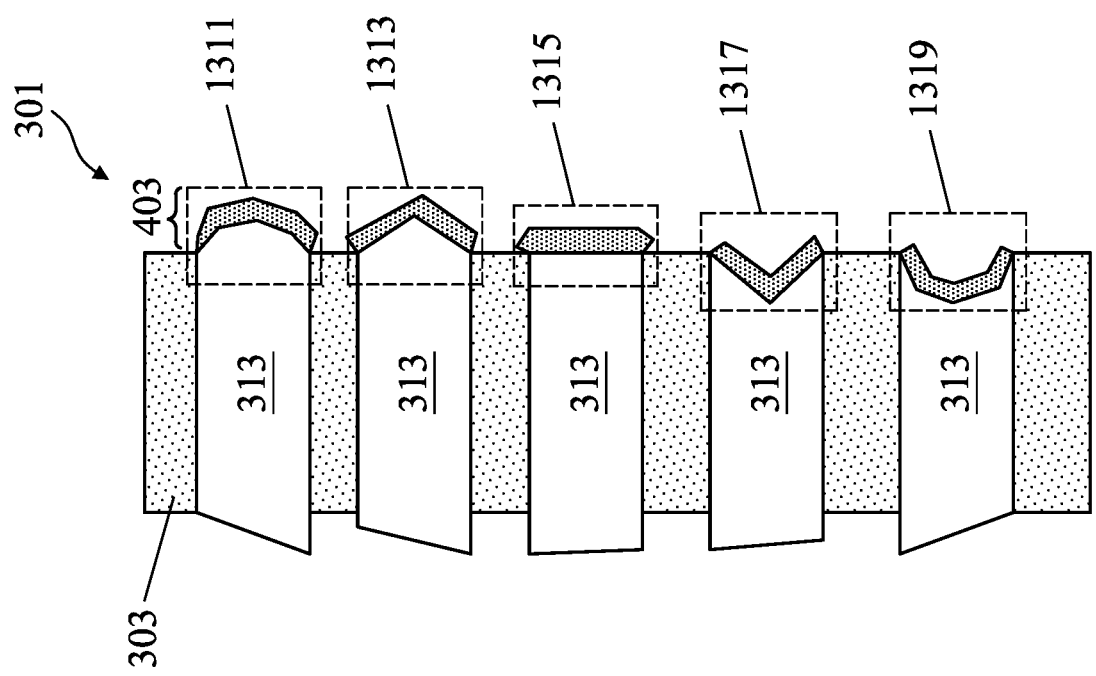

FIGS. 13A-13B illustrate ten different embodiments of interface profiles that may be formed and shaped at distal ends of the nanostructures 313 during first deposition process 450 as discussed above with regard to FIG. 4A. A great variety of interface profiles may be formed by tuning the flow rates of the precursors and materials used to form the channel interface structures 403. In particular, FIG. 13A illustrates five different embodiments of interface profiles that are facet-limited including a second interface profile 1301, a third interface profile 1303, a fourth interface profile 1305, a fifth interface profile 1307, and a sixth interface profiles 1309. Each of the channel interface structures 403 illustrated in FIG. 13A are shown formed with a facet-limited interface structure formed at a distal end of the nanostructures 313 shaped with the five channel profiles illustrated in FIG. 12, respectively. Additionally, while the interface profiles with different shapes have been shown in FIGS. 13A-13B as being formed on the same substrate 101, this is merely for convenience, as different processes will form different shapes.

In particular, FIG. 13A illustrates the channel interface structure 403 formed with the second interface profile 1301 at the end of the nanostructure 313 formed with the second channel profile 1201 (shown in FIG. 12). According to embodiments in which the channel interface structures 403 are formed using silicon precursors and are doped for example using n-type dopant (e.g., $PH_3$). The channel interface structures 403 may be formed to any of the second interface profile 1301 to the sixth interface profile 1309 having facet-limited surfaces by controlling the flow rate of the precursors to a suitable flow rate of between about 10 sccm and about 2000 sccm.

FIG. 13B illustrates five further embodiments of the channel interface structures 403 according to yet other embodiments. FIG. 13B is similar to FIG. 13A; however, FIG. 13B illustrates the formation of the channel interface structures 403 having conformal growth shaped profiles instead of facet-limited profiles. According to embodiments in which the channel interface structures 403 are formed using silicon precursors and are doped for example using n-type dopant (e.g., $PH_3$). The channel interface structures 403 may be formed to any of the seventh interface profile 1311 to the eleventh profile 1319 having a rounded conformal growth shape by controlling the flow rate of the precursors to a suitable flow rate of between about 10 sccm and about 2000 sccm.

In some embodiments, the first source/drain base structures 401 and the source/drain regions 501 are formed within the parasitic channel 207 and having a top of the first source/drain base structures 401 being above the parasitic channel 207. According to some embodiments, the first source/drain base structures 401 are lightly doped with n-type dopants and the source/drain regions 501 are heavily doped with n-type dopants. As such, the first source/drain base structures 401 provide high resistance layers formed adjacent the bottom channel which suppresses the leakage current for the first semiconductor device 800. Furthermore, the dopant levels at a drain-well junction of the first semiconductor device 800 are lowered and thus the leakage performance of the first semiconductor device 800 is improved. In some embodiments, the optional removal process 460 is performed to etch away the channel interface structures 403 using an in-situ etch precursor. As such, a performance of the first semiconductor device 800 is increased. According to some embodiments, the first source/drain base structures 401 are formed above the parasitic channel 207 and are doped with p-type dopants. As such, the boundary of depletion regions for the first semiconductor device 800 are pulled farther away from one another reducing a level of punch through leakage.

According to some embodiments, a method includes: forming an opening through a multilayer stack and into a substrate; depositing a first semiconductor material in the opening; forming a second semiconductor material over the first semiconductor material, the second semiconductor material being differently doped from the first semiconductor material; and forming a stack of nanostructures by removing sacrificial layers of the multilayer stack, the second semiconductor material being electrically coupled to the stack of nanostructures. In an embodiment the method includes forming channel interface structures at distal ends of the stack of nanostructures prior to forming the second semiconductor material. In an embodiment the channel interface structures comprise the first semiconductor material. In an embodiment the depositing the first semiconductor material comprises doping the first semiconductor material with an n-type dopant having a first dopant concentration and wherein forming the second semiconductor material comprises doping the second semiconductor material with an n-type dopant having a second dopant concentration, the second dopant concentration being greater than the first dopant concentration. In an embodiment the forming the second semiconductor material comprises doping the second semiconductor material with an n-type dopant and wherein the first semiconductor material is not doped. In an embodiment the depositing the first semiconductor material comprises doping the first semiconductor material with an p-type dopant and wherein forming the second semiconductor material comprises doping the second semiconductor material with an n-type dopant. In an embodiment the method includes removing channel interface structures prior to forming the second semiconductor material.

In other embodiments, a method includes: forming a channel in a multilayer structure; forming an opening in the channel, wherein after the forming the opening a first layer and a second layer of the multilayer structure are exposed along a sidewall of the opening; forming a bottom structure of a source/drain region along a bottom of the opening using a silicon precursor; and forming a top structure of the source/drain region over the bottom structure, the top structure comprising a semiconductor material and a first dopant, the top structure being formed using the silicon precursor and a first dopant precursor, the top structure being differently doped from the bottom structure. In an embodiment the forming the bottom structure comprises forming a channel region interface along a surface of the second layer. In an embodiment the forming the bottom structure comprises using the first dopant precursor, wherein after the forming the bottom structure the bottom structure has a second concentration of the first dopant that is less than a first concentration of the first dopant in the top structure. In an embodiment the method further includes, prior to the forming the top structure, removing the channel region interface. In an embodiment the first dopant is an n-type dopant. In an embodiment the forming the bottom structure comprises using a second dopant precursor, wherein after the forming the bottom structure the bottom structure has a second dopant that has an opposite conductivity from the first dopant. In an embodiment the bottom structure is undoped.

According to still further embodiments, a semiconductor device includes: a multilayer channel over a substrate; a source/drain bottom structure embedded within the substrate; and a source/drain top structure over and in contact with the source/drain bottom structure, wherein the source/drain top structure is doped different from the source/drain bottom structure. In an embodiment the semiconductor device further includes a channel interface structure between a nanostructure of the multilayer channel and the source/drain top structure. In an embodiment the source/drain top structure is n-doped and the source/drain bottom structure is n-doped less than the source/drain top structure. In an embodiment the source/drain bottom structure is undoped and the source/drain top structure is n-doped. In an embodiment the source/drain bottom structure is p-doped and the source/drain top structure is n-doped. In an embodiment a space between a top of the source/drain bottom structure and a bottom of a bottommost nanostructure of the multilayer channel is at least 3 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming an opening through a multilayer stack and into a substrate, the multilayer stack comprising alternating sacrificial layers and semiconductor layers, the opening exposing sidewalls of the sacrificial layers and the semiconductor layers;
depositing a first semiconductor material in the opening, wherein depositing the first semiconductor material comprises depositing a first portion along a bottom of the opening and a second portion on the sidewalls of the semiconductor layers, wherein the first semiconductor material and the semiconductor layers have a same conductivity type;
removing at least a portion of the second portion of the first semiconductor material;
forming a second semiconductor material over the first semiconductor material; and
forming a stack of nanostructures by removing the sacrificial layers of the multilayer stack, the second semiconductor material being electrically coupled to the stack of nanostructures, wherein an uppermost surface of the first semiconductor material is lower than a lower surface of a lowermost nanostructure of the stack of nanostructures in a cross-sectional view.

2. The method of claim 1, wherein the depositing the first semiconductor material comprises doping the first semiconductor material with an p-type dopant and wherein forming the second semiconductor material comprises doping the second semiconductor material with an n-type dopant.

3. The method of claim 1, wherein a height of the first semiconductor material is in a range between 3 nm and 30 nm.

4. The method of claim 1, wherein the second semiconductor material has a different conductivity type than the first semiconductor material.

5. The method of claim 1, wherein removing at least a portion of the second portion completely removes the second portion.

6. The method of claim 1, wherein the second portion on the sidewalls of the semiconductor layers are spaced apart from the first portion.

7. The method of claim 1, wherein the sidewalls of the semiconductor layers are convex.

8. The method of claim 1, further comprising:
forming inner spacers along sidewalls of the sacrificial layers, wherein the first portion contacts a bottommost inner spacer of the inner spacers.

9. A method comprising:
forming a channel in a multilayer structure, the multilayer structure comprising alternating first layers and second layers;
forming an opening in the channel, wherein after the forming the opening sidewalls of the first layers and the second layers are exposed along a sidewall of the opening;
after forming the opening, forming a bottom structure of a source/drain region along a bottom of the opening using a silicon precursor and forming a channel region interface structure along sidewalls of the second layers of the multilayer structure in the opening;
removing the channel region interface structure; and
after removing the channel region interface structure, forming a top structure of the source/drain region over the bottom structure, the top structure comprising a semiconductor material and a first dopant, the top structure being formed using the silicon precursor and a first dopant precursor, the top structure being differently doped from the bottom structure.

10. The method of claim 9, wherein the first dopant is an n-type dopant.

11. The method of claim 9, wherein the forming the bottom structure comprises using a second dopant precursor, wherein after the forming the bottom structure the bottom structure has a second dopant that has an opposite conductivity from the first dopant.

12. The method of claim 9, wherein the bottom structure has a convex upper surface.

13. The method of claim 9, wherein a distance between a bottommost second layer of the second layers of the multilayer structure and an upper surface of the bottom structure of is in a range between 3 nm and 20 nm.

14. The method of claim 9, further comprising forming inner spacers along sidewalls of the first layers of the multilayer structure, wherein the bottom structure of the source/drain region directly contacts one of the inner spacers.

15. A method comprising:
forming a channel in a multilayer structure, the multilayer structure comprising alternating first layers and second layers;
forming an opening in the channel, wherein after the forming the opening sidewalls of the first layers and the second layers are exposed along a sidewall of the opening;
after forming the opening, forming inner spacers along sidewalls of the first layers of the multilayer structure in the opening;
after forming the opening, forming a bottom structure of a source/drain region along a bottom of the opening using a silicon precursor and forming a channel region interface structure along sidewalls of the second layers of the multilayer structure in the opening;
removing the channel region interface structure; and
after removing the channel region interface structure, forming a top structure of the source/drain region over the bottom structure, the top structure comprising a semiconductor material and a first dopant, the top structure being formed using the silicon precursor and a first dopant precursor, the top structure being differently doped from the bottom structure.

16. The method of claim 15, wherein the bottom structure of the source/drain region is p-doped and the top structure of the source/drain region is n-doped.

17. The method of claim 15, wherein a distance between a top of the bottom structure of the source/drain region and a bottom of a bottommost layer of the second layers is at least 3 nm.

18. The method of claim 15, wherein the bottom structure and the second layers have a same conductivity.

19. The method of claim 15, wherein the bottom structure contacts a bottom inner spacer of the inner spacers.

* * * * *